(12) United States Patent
Khoa

(10) Patent No.: US 11,405,073 B2
(45) Date of Patent: Aug. 2, 2022

(54) POWER LINE COMMUNICATION APPARATUS AND PHOTOVOLTAIC POWER GENERATION MODULE

(71) Applicant: GIRASOL ENERGY Inc., Tokyo (JP)

(72) Inventor: Le Dinh Khoa, Tokyo (JP)

(73) Assignee: GIRASOL ENERGY INC., Tokyo (JP)

( * ) Notice: Subject to any disclaimer, the term of this patent is extended or adjusted under 35 U.S.C. 154(b) by 0 days.

(21) Appl. No.: 17/417,196

(22) PCT Filed: Dec. 25, 2019

(86) PCT No.: PCT/JP2019/050885
§ 371 (c)(1),
(2) Date: Jun. 22, 2021

(87) PCT Pub. No.: WO2020/138195
PCT Pub. Date: Jul. 2, 2020

(65) Prior Publication Data
US 2022/0109468 A1    Apr. 7, 2022

(30) Foreign Application Priority Data

Dec. 25, 2018 (JP) .............................. JP2018-240663

(51) Int. Cl.
*H04B 3/54* (2006.01)
*H03K 17/56* (2006.01)

(52) U.S. Cl.
CPC ............... *H04B 3/54* (2013.01); *H03K 17/56* (2013.01); *Y04S 40/121* (2013.01)

(58) Field of Classification Search
CPC .......... H04B 3/54; H04B 14/02; H03K 17/56; H02J 13/00009; Y04S 40/121
See application file for complete search history.

(56) References Cited

U.S. PATENT DOCUMENTS

| | | | |
|---|---|---|---|
| 11,264,947 B2* | 3/2022 | Adest | G01R 31/40 |
| 2013/0009483 A1* | 1/2013 | Kawate | H02J 13/00002 307/77 |
| 2015/0016159 A1* | 1/2015 | Deboy | H02M 7/4807 363/71 |

OTHER PUBLICATIONS

H. Ochiai et al., "PPLC-PC: A Pulse Power Line Communication for Series-Connected PV Monitoring", 2016 IEEE International Conference on Smart Grid Communications (SmartGridComm), Nov. 6, 2016, pp. 1-7.

* cited by examiner

Primary Examiner — David S Huang
(74) Attorney, Agent, or Firm — Polsinelli PC

(57) ABSTRACT

Provided is a power line communication device for use in an electric power generation system. The power line communication device is provided with: a positive input terminal connected to a positive pole of an electric generator; a negative input terminal connected to a negative pole of the electric generator; a positive output terminal connected to the downstream side of a power line for transmitting electric power generated by the electric generator; a negative output terminal connected to the upstream side of the power line; a current pulse generator which is connected between the negative input terminal and the positive output terminal and generates a current pulse in the power line; and a controllable unidirectional device which is connected between the positive input terminal and the positive output terminal and is capable of performing impedance control.

17 Claims, 13 Drawing Sheets

POWER LINE COMMUNICATION APPARATUS AND PHOTOVOLTAIC POWER GENERATION MODULE

CROSS REFERENCE TO RELATED APPLICATIONS

This application is a National Phase filing under 35 U.S.C. § 371 of PCT/JP2019/050885 filed on Dec. 25, 2019; which application in turn claims priority to Application No. 2018-240663 filed in Japan on Dec. 25, 2018. The entire contents of each application are hereby incorporated by reference.

TECHNICAL FIELD

The present disclosure relates to a power line communication apparatus and a photovoltaic power generation module.

BACKGROUND ART

Generally, in order to maintain the proper state of power generation systems used in photovoltaic, wind, hydroelectric, geothermal, thermal, and nuclear power generation or the like, power storage using batteries, and power supply systems, monitoring systems have been introduced to monitor whether the system is operating normally and to detect abnormalities. Recently, a mechanism has also been provided to remotely monitor by transmitting signals obtained by monitoring, using advanced communication technology utilizing power lines for transmitting the generated power.

SUMMARY OF INVENTION

Technical Problem

There is a need to reduce running costs including power consumption in such monitoring systems and IoT systems. In addition, there are problems such as deterioration of parts and lowering of service life caused by temperature rise due to power consumption. It is an object of the present disclosure to solve at least one of these.

Solution to Problem

The power line communication apparatus of the present disclosure comprises: a positive input terminal to be connected to a positive pole of a generator; a negative input terminal to be connected to a negative pole of the generator; a positive output terminal to be connected to the downstream side of a power line through which the power generated by the generator is transmitted; a negative output terminal to be connected to the upstream side of the power line; a current pulse generator to be connected between the negative input terminal and the positive output terminal to generate a current pulse in the power line; and a controllable unidirectional device to be connected between the positive input terminal and the positive output terminal, wherein the impedance is controllable.

Advantageous Effects of Invention

According to the present disclosure, by way of example, the power consumption in power line communications used in power generation systems can be reduced and the running costs can be reduced. Secondary, the temperature rise in the apparatus can be suppressed to ensure the safety and prolong the life of the electrical and electronic elements.

DESCRIPTION OF EMBODIMENTS

Figure 1:
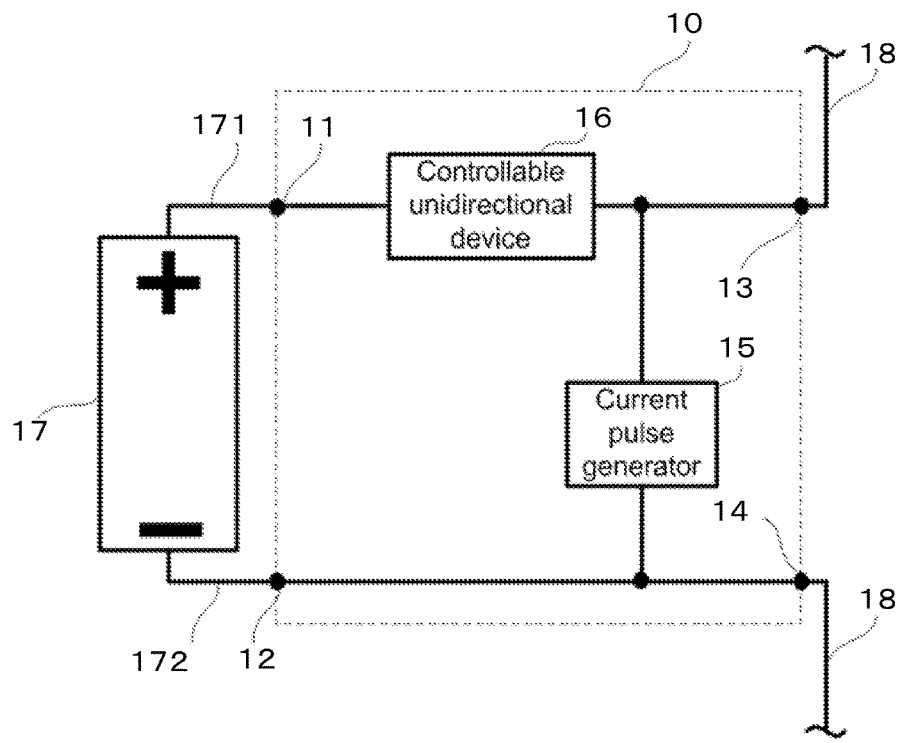
FIG. 1 shows a configuration example of a power line communication apparatus according to an embodiment.

The term "power generation system" as used herein generally refers to a system having or comprising a power generator, a power generation element, a power generation unit, a power generation configuration (hereinafter, sometimes referred to as a power generation unit or a power generator) such as a photovoltaic power generation unit, a wind power generation unit, a hydroelectric power generation unit, a geothermal power generation unit, a thermal power generation unit, a nuclear power generation unit, an electric cell unit, a fuel cell unit, and the like. The type of power generation is not limited to the above. The power transmission in a power generation system may be a direct current type in some embodiments, and may be an alternating current type in some embodiments, and may have a direct current type and an alternating current type in some embodiments. The power generation system may have one power generation unit in some embodiments, and may have a plurality of power generation units in some embodiments. The power generation system may have a single type of power generation unit or the like, and may have a plurality of types of power generation units. In some embodiments, the power generation system may have a string having a plurality of power generation units. In some embodiments, the power generation system may have a plurality of strings. In some embodiments, the power generation system may have a plurality of strings connected in parallel or in series.

The "power communication apparatus" is configured to be electrically connected and attached to a separate generator (generation unit). The power communication apparatus has four electrical connection terminals, or two input terminals and two output terminals, i.e. a positive input terminal, a negative input terminal, a positive output terminal, and a negative output terminal. The positive input terminal is configured to be connected to the output of the positive pole of the generator. The negative input terminal is configured to be connected to the output of the negative pole of the generator. The positive output terminal is configured to be connected to the downstream side of the power line in which the power generated by the generator is transmitted. The negative output terminal is configured to be connected to the upstream side of the power line.

In some embodiments, the power line apparatus may be fixed to the generator. In some embodiments, the power line apparatus may be detachably connected or attached to the power generation apparatus. In some embodiments, one power line apparatus may be attached to each of all generators in the power generation system. In some embodiments, it may be attached to a part of the power generators in the power generation system. In some embodiments, it may be attached to one or more generators in the power generation system. In some embodiments, it may be attached to selected generators in the power generation system, or it may be attached to a plurality of generators at random. In some embodiments associated with the photovoltaic power generation system, the generator to which a power line communication apparatus is disposed may be selected depending on the sunshine condition distribution, weather condition distribution, temperature distribution in the photovoltaic system, the location in the photovoltaic system, the location in the string, or the like.

As used herein, the term "current pulse generator" generally refers to an electrical element, an electrical circuit, or an electrical device that generates an electrical signal. In some embodiments, the current pulse generator may generate a current signal. In some embodiments, the current pulse generator may generate a voltage signal. In some embodiments, the current pulse generator may generate an electrical signal defined by a voltage and a current. In some embodiments, the current pulse generator may generate a time-separated signal or signal group. In some embodiments, the current pulse generator may generate electrical signals that vary continuously in time. In some embodiments, the current pulse generator may generate a digital signal. In some embodiments, the current pulse generator may generate an analog signal. In some embodiments, the current pulse generator may be configured to be capable of generating both a digital signal and an analog signal. In some embodiments, the current pulse generator may be configured to emit a signal using one, a plurality of, or at least one modulation method.

The current pulse generator modulation method may be selected from, for example, analog modulation such as amplitude modulation (AM), angle modulation (for example, frequency modulation (FM), phase modulation (PM)) and the like; digital modulation such as phase shift modulation (PSK) frequency shift modulation (FSK), amplitude shift modulation (ASK), quadrature amplitude modulation (QAM) and the like; pulse modulation such as pulse code modulation (PCM), pulse width modulation (PWM), pulse amplitude modulation (PAM), pulse position modulation (PPM), pulse density modulation (PDM); and the like; and may be other modulation methods.

The current pulse generator is connected between the negative input terminal and the positive output terminal. The signal generation of the current pulse generator may be controlled by an internal or external electrical circuit or other configurations. In some embodiments, the current pulse generator is configured to be connected to a controller and may be configured to be controlled by signals or inputs from the controller.

As used herein, the term "controllable unidirectional device" generally refers to an electrical element, an electrical circuit, or an electrical device that is configured such that its impedance is controllable or variable (hereinafter sometimes referred to as "control") and the current flowing therethrough flows substantially only in one direction. A controllable unidirectional device may be connected between the positive input terminal and the positive output terminal. The controllable unidirectional device is configured to allow current to flow only in the direction from the positive input terminal to the positive output terminal. The impedance of the controllable unidirectional device may be controlled by an internal or external electrical circuit or other configurations. In some embodiments, the controllable unidirectional device is configured to be connected to a controller and may be configured to be controlled by signals or inputs from the controller.

In some embodiments, the controllable unidirectional device may be controlled so that its impedance takes different values between while the current signal generator is not generating an electrical signal and while the current signal generator is generating an electrical signal. In some embodiments, the controllable unidirectional device may be configured to function such that the impedance while the current signal generator is not generating an electrical signal ($Z_n$) is smaller than the impedance while the current signal generator is generating an electrical signal ($Z_p$).

The term "connection" means an electrical connection unless otherwise stated or interpreted from the meaning of the description. Electrical connections are not limited to direct connections between components relating to the inventions or embodiments described in this application, but also include indirect connections in which additional electrical components are included between components relating to the inventions or embodiments.

Hereinafter, some embodiments of the present disclosure will be described with reference to the drawings.

FIG. 1 shows a configuration example of a power line communication apparatus according to an embodiment. Power line communication apparatus 10 shown in FIG. 1 is configured to comprise a positive input terminal 11, a negative input terminal 12, a positive output terminal 13, a negative output terminal 14, a current pulse generator 15, and a controllable unidirectional device 16.

As shown in FIG. 1, the power line communication apparatus 10 is connected in parallel with a DC generator 17. The positive input terminal 11 of the power line communication apparatus 10 is connected to the positive terminal 171 of the DC generator 17 (the output of the positive pole of the DC generator 17), and the negative input terminal 12 of the power line communication apparatus 10 is connected to the negative terminal 172 of the DC generator 17 (the output of the negative pole of the DC generator 17).

The positive output terminal 13 of the power line communication apparatus 10 is connected to the downstream side of the power line 18 (the side connected from the positive pole of the DC generator 17), and the negative output terminal 14 of the power line communication apparatus 10 is connected to the upstream side of the power line 18 (the side connected from the negative pole of the DC generator 17). The power line 18 may transmit power generated by the DC generator 17.

Figure 17:
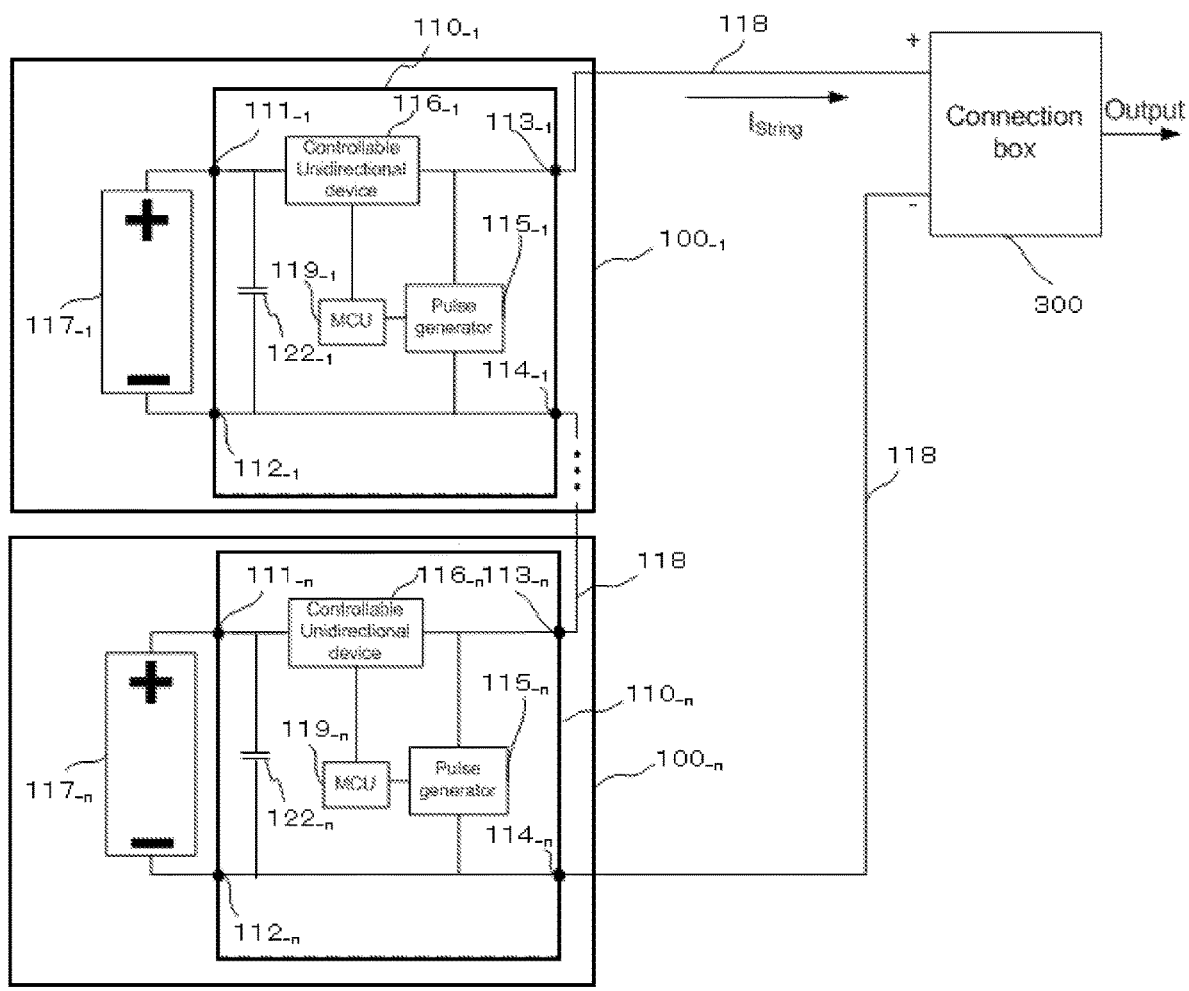
FIG. 17 shows a block diagram illustrating a configuration example of a generator string according to an embodiment.

In some embodiments, when configuring a generator string, the power line 18 is used to electrically connect a plurality of DC generators 17 in series (see for example, FIG. 17).

The current pulse generator 15 is connected between the negative input terminal 12 or the negative output terminal 14 and the positive output terminal 13 to generate current pulses on the power line 18. The current pulses are generated in a direction from the negative output terminal 14 of the current pulse generator 15 to the positive output terminal 13.

The controllable unidirectional device 16 is connected between the positive input terminal 11 and the positive output terminal 13, and is configured such that the value of its impedance can be controlled, the current flowing therethrough is substantially unidirectional. In FIG. 1, the current flowing through the controllable unidirectional device 16 flows only in the direction from the positive input terminal 11 to the positive output terminal 13. The controllable unidirectional device 16 can function so that the impedance while the current pulse is not being generated ($Z_n$) is smaller than the impedance while the current pulse is being generated ($Z_p$).

Although the DC generator 17 is used as an example of the generator in FIG. 1, the present disclosure is not limited thereto. For example, the generator may be an AC generator. The generator may be a photovoltaic generator or a photovoltaic panel, or may include these. The generator may be, or may include, a battery, a battery storage system, a fuel cell, a wind power generator, a thermoelectric generator. The generator may be or include a combination of a plurality of generators of the same type. The generator may be or include a combination of a plurality of generators of different types.

In FIG. 1, the power line 18 is a DC power line, but may be an AC power line. When configuring a generator string, the power line 18 is capable of electrically connecting a plurality of power line communication apparatuses 10 in series. The positive output terminal 13 and the negative output terminal 14 of the power line communication apparatus 10 may be set on the power line 18 in series with other power line communication apparatuses (not shown).

Figure 2:
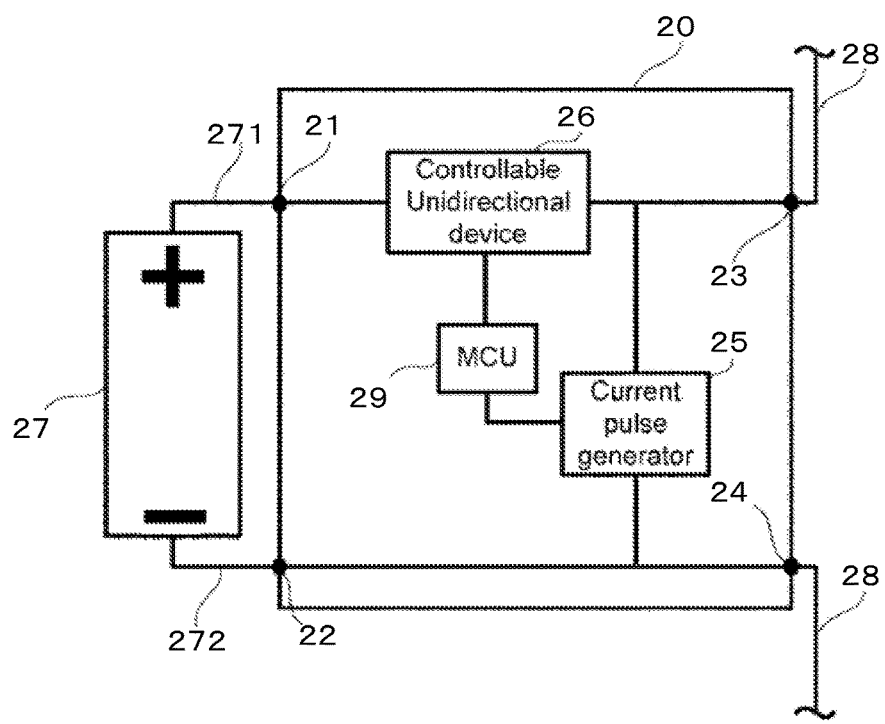
FIG. 2 shows a configuration example of a power line communication apparatus according to an embodiment.

Power line communication apparatus 20 shown in FIG. 2 is configured to comprise a positive input terminal 21, a negative input terminal 22, a positive output terminal 23, a negative output terminal 24, a current pulse generator 25, a controllable unidirectional device 26, MCU (Micro Control Unit, controller) 29. In FIG. 2, MCU 29 may be controlled for both the current pulse generator 25 and the controllable unidirectional device 26.

As shown in FIG. 2, the power line communication apparatus 20 is connected in parallel with the DC generator 27. The positive input terminal 21 of the power line communication apparatus 20 is connected to the positive terminal 271 of the DC generator 27 (the output of the positive pole of the DC generator 27), and the negative input terminal 22 of the power line communication apparatus 20 is connected to the negative terminal 272 of the DC generator 27 (the output of the negative pole of the DC generator 27).

The positive output terminal 23 of the power line communication apparatus 20 is connected to the downstream side of the power line 28 (the side connected from the positive pole of the DC generator 27), and the negative output terminal 24 of the power line communication apparatus 20 is connected to the upstream side of the power line 28 (the side connected from the negative pole of the DC generator 27). The power line 28 can transmit power generated by the DC generator 27.

MCU 29 receives information or signals from various sensors and detectors regarding the properties or status of the DC generator 27 (specific details will be described later).

The MCU 29 may transmit the required instructions as control signals to the current pulse generator 25 to control the current pulse generation of the current pulse generator 25, based on the received information, a program which is predetermined or updated, another information or program, or a mixture thereof.

MCU 29 may transmit the required instructions as control signals to the controllable unidirectional device 26 to control the impedance of the controllable unidirectional device 26, based on the received information, a program which is predetermined or updated, another information or program, or a mixture thereof.

In some embodiments, MCU 29 may control an electronic control switch in the controllable unidirectional device 26, which will be described below. In some embodiments, the electronic control switch may be opened by the control signal provided by MCU 29 to the electronic control switch, to block the flow of reverse current from the current pulse generator 25 to the DC generator 27, while the current pulse generator 25 is generating current pulses to the power line 28. In some embodiments, the electronic control switch may be closed by the control signal provided by MCU 29 to the electronic control switch, to control the controllable unidirectional device 26, while the current pulse generator 25 is not generating current pulses to the power line 28.

Signals or information transmitted from the various sensors or detectors to MCU 29, and control signals transmitted from MCU 29 to the current pulse generator 25 and the controllable unidirectional device 26 may be analog signals, digital signals, electrical signals, or electromagnetic or optical signals.

For example, MCU 29 may synchronize the control of the current pulse generator 25 with the control of the controllable unidirectional device 26, by using a scheduling of current pulse generation of the current pulse generator 25. That is, MCU 29 can control the current pulse generator 25 to generate a current pulse and synchronously control the controllable unidirectional device 26 to block the flow of reverse current. When configuring a generator string, MCU 29 comprised in the power line communication apparatus 20 may communicate with other MCUs included in other power line communication apparatuses to forward its current pulsing schedules to the other power line communication apparatuses.

In some embodiments, a power conditioner system may comprise the MCU 29. In some embodiments, MCU 29 may be part of a separate control circuit.

Although FIG. 2 shows a configuration in which one MCU 29 controls the current pulse generator 15 and the controllable unidirectional device 26, the present disclosure is not limited thereto. For example, the power line communication apparatus 20 may comprise two MCUs, such that the first MCU (first controller) controls the current pulse generator 25, the second MCU (second controller) controls the controllable unidirectional device 26. The first MCU and the second MCU may be connected or configured to communicate with each other.

Figure 3:
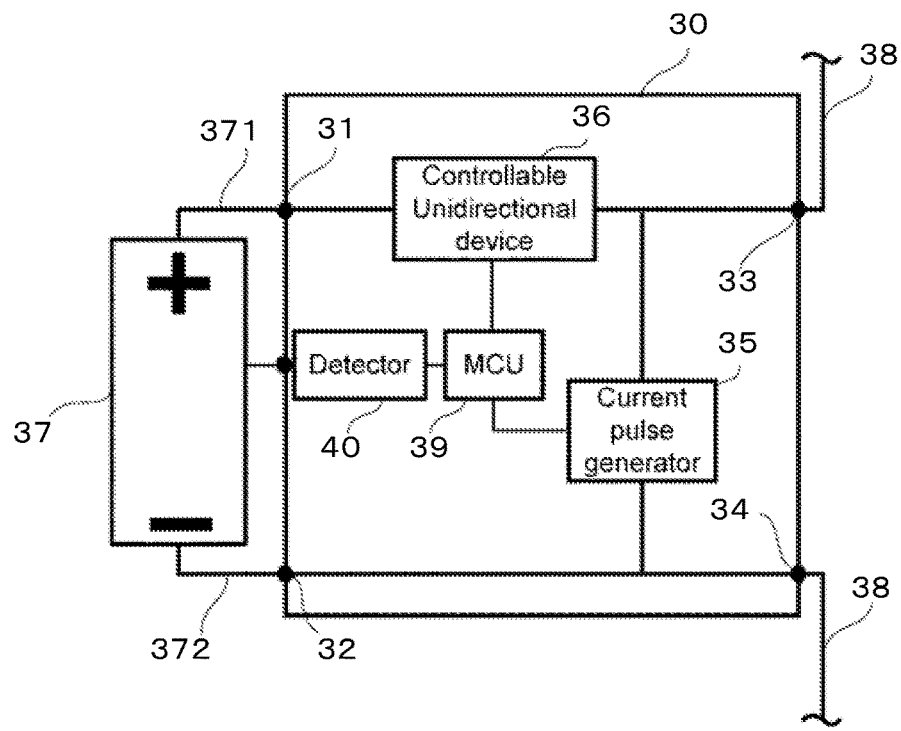
FIG. 3 shows a configuration example of a power line communication apparatus according to an embodiment.

Power line communication apparatus 30 shown in FIG. 3 is configured to receive information related to the monitoring items from the DC generator 37 or sensors connected or arranged to the DC generator 37. MCU 39 shown in FIG. 3 may receive information from the DC generator 37, encode the information, and send an instruction to the current pulse generator 35 and the controllable unidirectional device 36 to transmit it by power line communication.

As shown in FIG. 3, the power line communication apparatus 30 is connected in parallel with the DC generator 37. The positive input terminal 31 of the power line communication apparatus 30 is connected to the positive terminal 371 of the DC generator 37 (the output of the positive pole of the DC generator 37), and the negative input terminal 32 of the power line communication apparatus 30 is connected to the negative terminal 372 of the DC generator 37 (the output of the negative pole of the DC generator 37).

The positive output terminal 33 of the power line communication apparatus 30 is connected to the downstream side of the power line 38 (the side connected from the positive pole of the DC generator 27), and the negative output terminal 34 of the power line communication apparatus 30 is connected to the upstream side of the power line 38 (the side connected from the negative pole of the DC generator 37). The power line 38 may transmit power generated by the DC generator 37.

In the example shown in FIG. 3, the detection circuit 40 detects the state of the DC generator 37 and transmits the detected information to MCU 39. MCU 39 encodes the information received from the detection circuit 40 to a series of pulses. In some embodiments, instructions from MCU 39 to each control object may be a digital signal, such as a pulse train, an analog signal, or other types of signals. MCU 39 uses the encoded pulses to control the current pulse generator 35 and generate a current pulse train for the power line 38. The current pulse train includes information on the state of the DC generator 37 detected by the detection circuit 40. MCU 39 controls the controllable unidirectional device 36 in a manner synchronized with the current pulses generated by the current pulse generator 35, to prevent the current pulses from flowing back to the DC generator 37.

Although FIG. 3 shows a configuration in which the power line communication apparatus 30 comprises the detection circuit 40, the present disclosure is not limited thereto. For example, the DC generator 37 may be configured to comprise a detection circuit 40. Alternatively, it may be configured to comprise the detection circuit 40 as part of the inverter system. Alternatively, the detection circuit 40 may be a separate electrical circuit.

Figure 4:
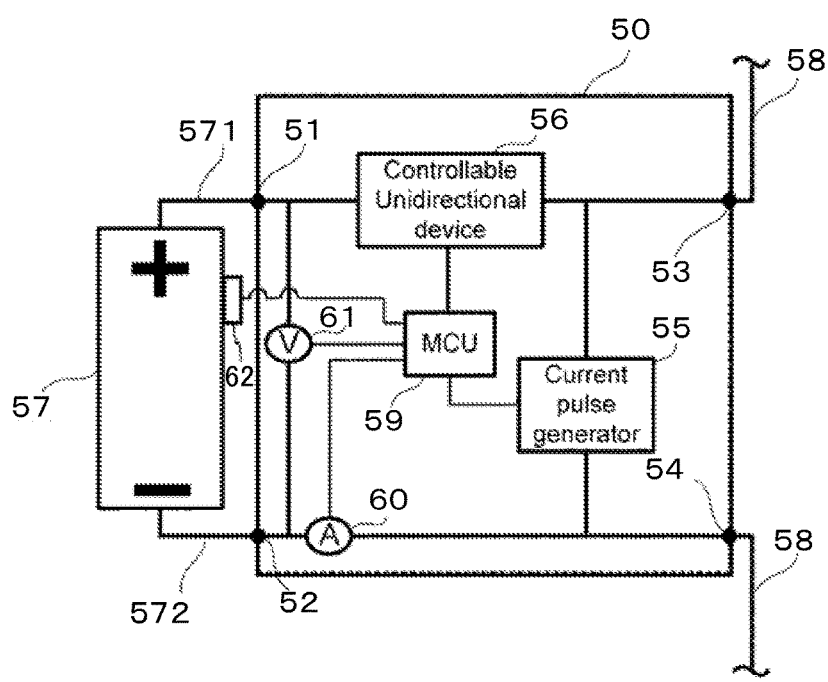
FIG. 4 shows a configuration example of a power line communication apparatus according to an embodiment.

FIG. 4 shows a second example in which MCU 59 receives information related to the characteristics or states of the DC generator 57 and controls the current-pulse generator 55.

As shown in FIG. 4, the power line communication apparatus 50 is connected in parallel with the DC generator 57. The positive input terminal 51 of the power line communication apparatus 50 is connected to the positive terminal 571 of the DC generator 57 (the output of the positive pole of the DC generator 57), and the negative input terminal 52 of the power line communication apparatus 50 is connected to the negative terminal 572 of the DC generator 57 (the output of the negative pole of the DC generator 57).

The positive output terminal 53 of the power line communication apparatus 50 is connected to the downstream side of the power line 58 (the side connected from the positive pole of the DC generator 57), and the negative output terminal 54 of the power line communication apparatus 50 is connected to the upstream side of the power line 58 (the side connected from the negative pole of the DC generator 57). The power line 58 may transmit power generated by the DC generator 57.

The power line communication apparatus 50 according to an example shown in FIG. 4 comprises or is connected to a current sensor (a current measuring instrument, for example, an ammeter) 60, a voltage sensor (voltage measuring instrument, for example, a voltmeter) 61 and a temperature sensor (a thermometer, for example, a primary thermometer, a secondary thermometer, a thermocouple, a resistance thermometer, a non-contact thermometer, or the like) 62. These sensors measure the current, voltage and temperature of the DC generator 57, respectively, and transmit the measured information to MCU 59. MCU 59 encodes the data received from the sensors 60 to 62 to a series of pulses. MCU 59 uses the encoded pulses to control the current pulse generator 55 and generate a current pulse train for the power line 58. The train of current pulses includes information related to the current, voltage and temperature of the DC generator 57 measured by respective sensors 60 to 62. MCU 59 controls the controllable unidirectional device 56 in a manner synchronized with the current pulses generated by the current pulse generator 55, to prevent the current pulses from flowing back to the DC generator 57.

Although FIG. 4 shows a configuration in which the power line communication apparatus 50 comprises the current sensor 60 and the voltage sensor 61, the present disclosure is not limited thereto. For example, the DC generator 57 may be configured to comprise the current sensor 60 and the voltage sensor 61. Alternatively, the current sensor 60 and the voltage sensor 61 may be separate electrical circuits.

In some embodiments, MCU is an example of a controller and may control either one of or both of the current pulse generator and the controllable unidirectional device. In some embodiments, MCU (controller) may control both the current pulse generator and the controllable unidirectional device in synchronization. In some embodiments, MCU (controller) may include two or a plurality of controllers. In some embodiments, one MCU may control the current pulse generator and another MCU may control the current pulse generator. In some embodiments, two or a plurality of controllers may be connected to each other or unidirectionally, to synchronize the timing and the like and control each target component.

In some embodiments, the pulse may have sufficiently different current values applied to the current generated by the DC generator (generated current). In some embodiments, the pulse may have a current value of the intensity, feature, form, which may be recognized as a signal for the current generated by the DC generator (generated current) or a time profile of the current value. The pulse may be a positive current with respect to the generated current and may be a negative current. The generated current may be zero. Photovoltaic panels, for example, do not generate electricity at night or during times when they are not sufficiently exposed to sunlight, so the generation current is zero. Pulses may be generated during that time.

In some embodiments, the pulse may have an amplitude greater than the noise in the current flowing through the power line. When configuring a generator string, the pulses may be generated such that the amplitude of the pulses received at (for example, a junction box to be described later) is greater than the noise level at the receiver. When configuring a generator string, the pulse characteristics including amplitude may degrade or change as the pulse travels through power lines, various devices, and the like on the string. In some embodiments, the pulse may have approximately the same amplitude as the noise in the current flowing through the power line. In some embodiments, the pulse may have an amplitude that is smaller than the noise in the current flowing through the power line. The noise may be removed or reduced, such as by filtering. In some embodiments, the pulse may be generated so as to be distinguished or identified from noise by the receiver.

Figure 5A:
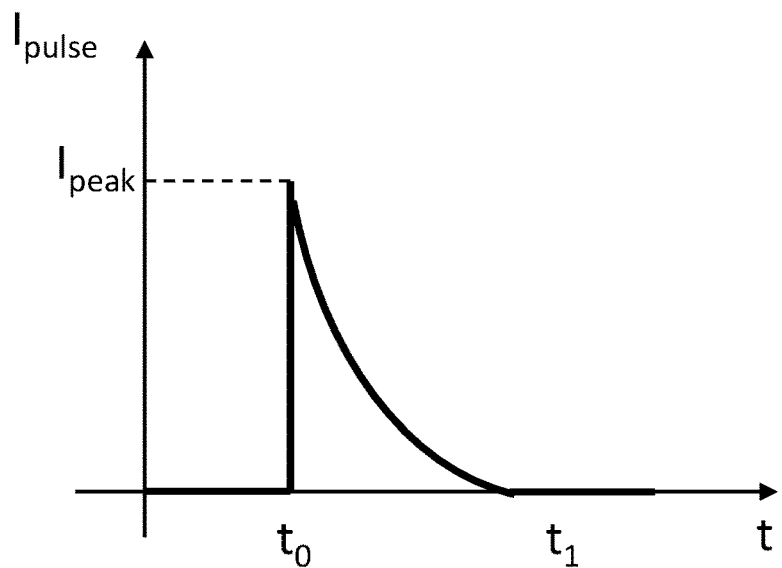
FIG. 5A shows a diagram for explaining a waveform of a current pulse.
Figure 5B:
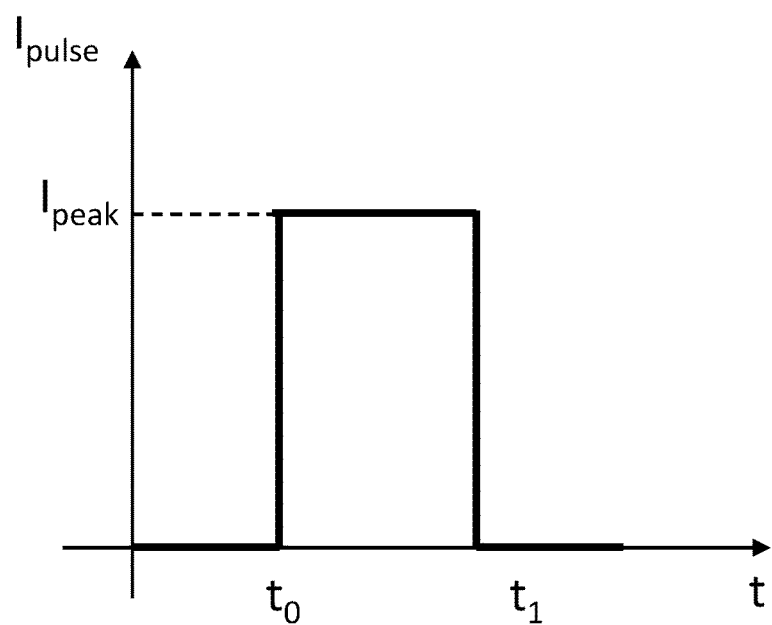
FIG. 5B shows a diagram for explaining a waveform of a current pulse.
Figure 5C:
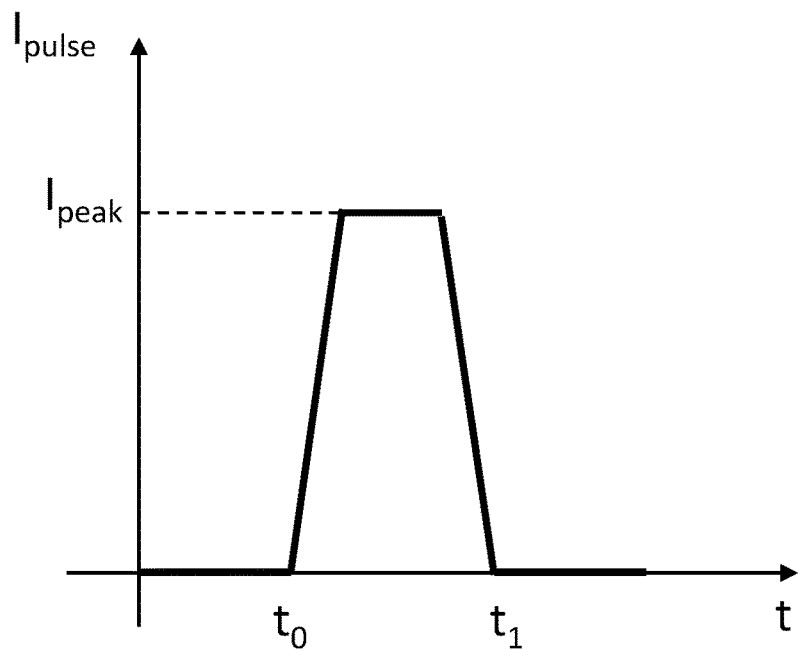
FIG. 5C shows a diagram for explaining a waveform of a current pulse.
Figure 5D:
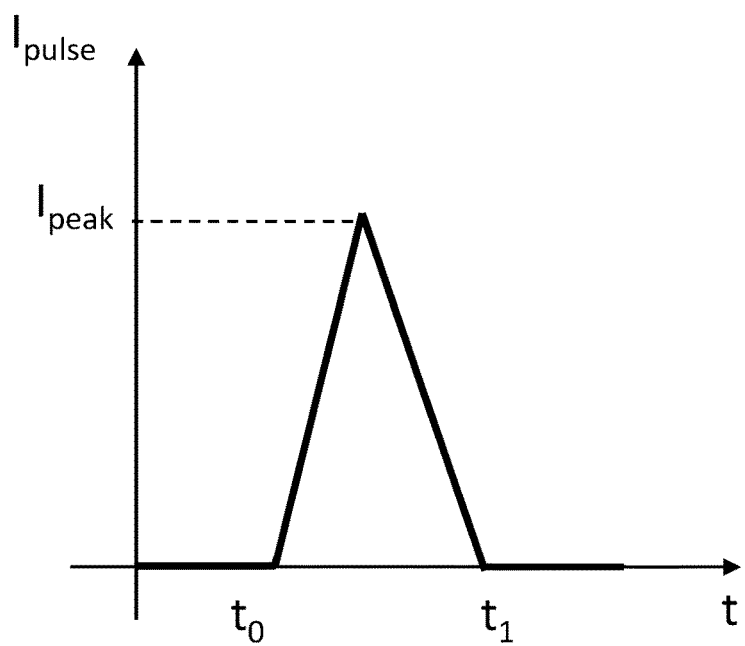
FIG. 5D shows a diagram for explaining a waveform of a current pulse.

A current pulse can have the shape of the induced discharge current of the generated current (FIG. 5A), a triable (FIG. 5B), a trapezoid (FIG. 5C), a square, a rectangle (FIG. 5D) or other shapes. The individual current pulse may be defined by a start point and an end point. The current pulse may have a starting point at a reference current level such as background, generation current and the like or the zero point. The zero point may have substantially the same current value at the start point and the end point, or may have a different current value. The current pulse may have an endpoint at the zero point. The current pulse may have a peak point (or peak) between the start point and the end point. The current pulse may have one peak point or a plurality of peak points between the start point and the end point. The value of the peak point may be a positive value (i.e., greater than the zero point) or may be a negative value (i.e., smaller than the zero point) relative to the zero point.

In some embodiments, the current pulse generator may include an electrical circuit. In some embodiments, it may be generated by a pulse generator. In some embodiments, the current pulse generator may be configured to comprise a coil.

Figure 6A:
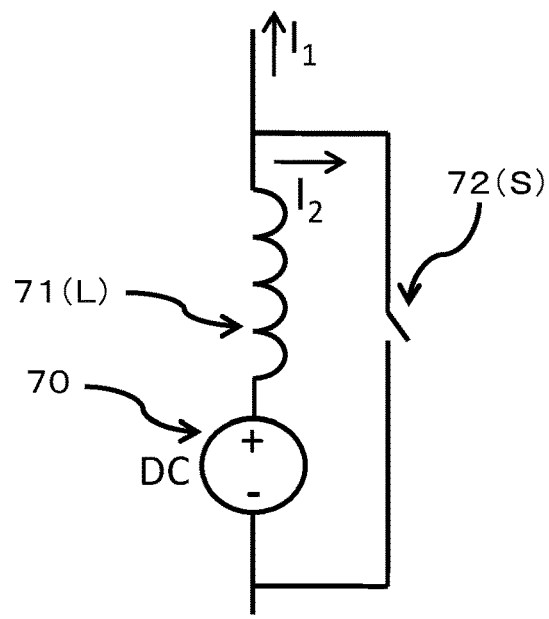
FIG. 6A shows a circuit diagram illustrating a configuration example of a current pulse generator according to an embodiment.

FIG. 6A to FIG. 6D illustrate non-limiting configuration examples of a current-pulse generator having a coil. In some embodiments, the current pulse generator may be configured to have a DC source 70, a coil 71 connected in series, and a switch 72 connected in parallel thereto (FIG. 6A).

Figure 6B:
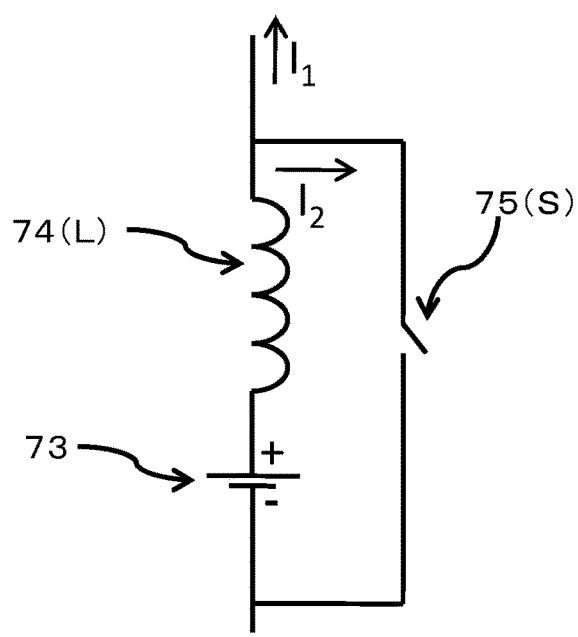
FIG. 6B shows a circuit diagram illustrating a configuration example of a current pulse generator according to an embodiment.

In some embodiments, the current pulse generator may be configured to have a battery 73, a coil 74 connected in series, and a switch 75 connected in parallel thereto (FIG. 6B).

Figure 6C:
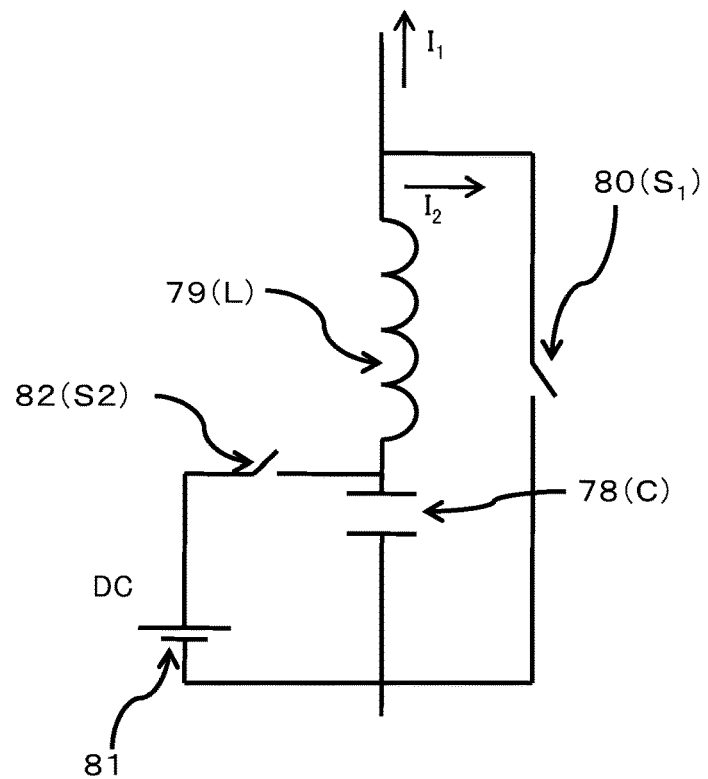
FIG. 6C shows a circuit diagram illustrating a configuration example of a current pulse generator according to an embodiment.

In some embodiments, the current pulse generator may be configured to have a capacitor 78, a coil 79 connected in series, a first switch 80 connected in parallel thereto, an electric battery (battery) 81 or a DC power supply (not shown) connected in parallel to the capacitor 78, and a second switch 82 (FIG. 6C). The electric battery (battery) 81 charges the capacitor 78 via the second switch 82 and the first switch 80 is opened so that the charge stored in the capacitor 78 is released as current pulses through the coil 79.

Figure 6D:
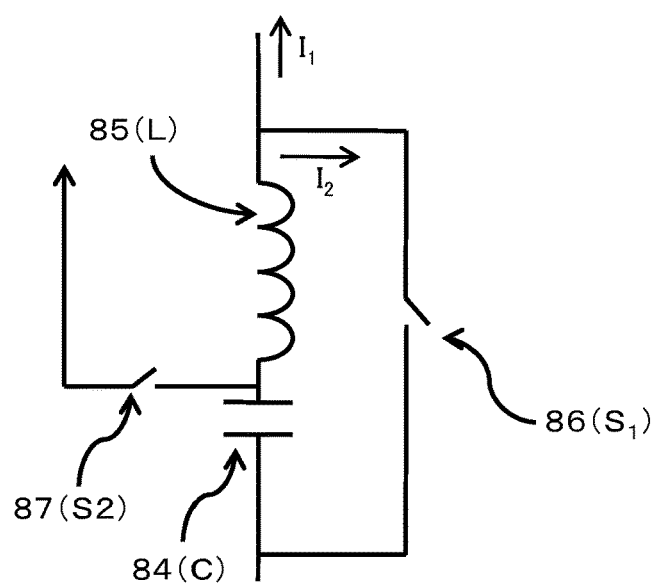
FIG. 6D shows a circuit diagram illustrating a configuration example of a current pulse generator according to an embodiment.

In some embodiments, the current pulse generator may be configured to have a capacitor 84, a coil 85 connected in series, a first switch 86 connected in parallel thereto, a wire configured to be connected to the outside from a point between the capacitor 84 and the coil 85, and a second switch 87 for opening and closing the wire (FIG. 6D).

The other end of the second switch 87 may be connected to the positive input terminal of the power line communication apparatus and may be connected between the positive input terminal of the power line communication apparatus and the input terminal of the controllable unidirectional device. For example, the other end of the second switch 87 of FIG. 6D may be connected between the positive input terminal 11 or the positive input terminal 11 and the input terminal of the controllable unidirectional device 16 of FIG. 1, between the positive input terminal 21 or the positive input terminal 21 and the input terminal of the controllable unidirectional device 26 of FIG. 2, between the positive input terminal 31 or the positive input terminal 31 and the input terminal of the controllable unidirectional device 36 of FIG. 3, between the positive input terminal 41 or the positive input terminal 41 and the input terminal of the controllable unidirectional device 56 of FIG. 4. The connection destination of the other end of the second switch 87 is not limited to the positive input terminal of the power line communication apparatus or between the positive input terminal and the input terminal of the controllable unidirectional device. The other end of the second switch 87 may be connected to an appropriate power supply or to a current supply path, to charge the capacitor 84. In some embodiments, the other end of the second switch 87 may be connected to an emergency power supply battery or a secondary (for example, nighttime) battery or the like. Thus, for example, in the photovoltaic power generation, current pulses can be generated even when a photovoltaic panel installed in the power line communication apparatus is not functioning due to a failure or the like, or at night without sunlight.

The current pulse generators shown in FIG. 6A to FIG. 6C contain a power supply for pulse generation. The current pulse generator shown in FIG. 6D receives the power of pulse generation from outside, particularly a DC generator to which a power communication device is connected, and stores it in the capacitor 84. Hereinafter, the switch 72 of FIG. 6A and the switch 75 of FIG. 6B are collectively represented as "switch S", the switch 80 of FIG. 6C and the switch 86 of FIG. 6D are collectively represented as "first switch $S_1$", the switch 82 of FIG. 6C and the switch 87 of FIG. 6D are collectively represented as "second switch $S_2$". Further, the coil 71 of FIG. 6A, the coil 74 of FIG. 6B, the coil 79 of FIG. 6C, and the coil 85 of FIG. 6D are collectively represented as "coil L". Further, the capacitor 78 of FIG. 6C and the capacitor 84 of FIG. 6D are collectively represented as "capacitor C".

The current pulse generators shown in FIG. 6A to FIG. 6D can open the switch S or the first switch $S_1$, open part or all of the energy stored in the power supply or capacitor contained therein and re-close the switch S or the first switch $S_1$, to generate a single pulse. The current pulse generator can generate a plurality of pulses by repeating the above.

Figure 7:
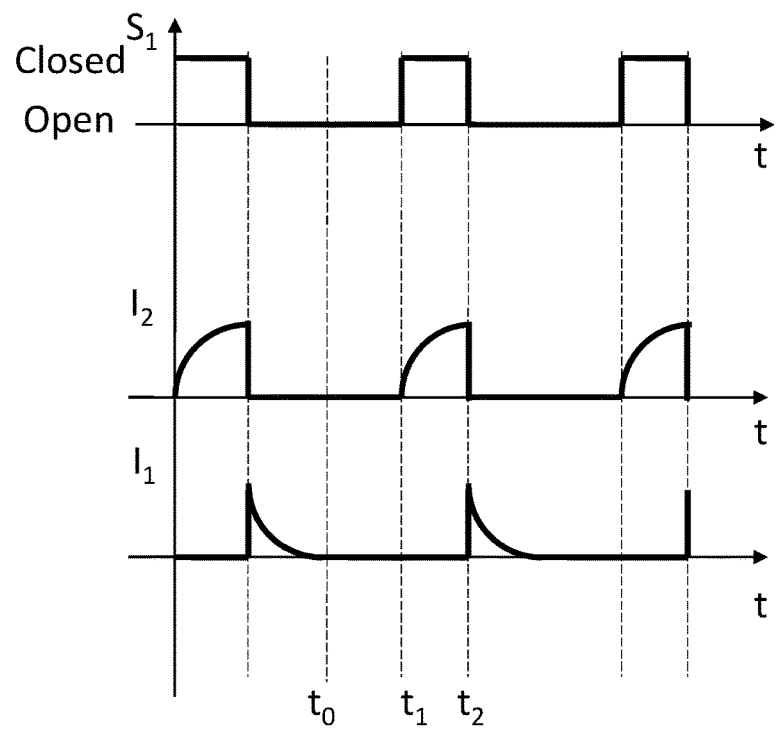
FIG. 7 shows a timing chart for explaining the synchronous control of a current pulse generator and a controllable unidirectional device according to an embodiment.

FIG. 7 shows a timing chart of the switch S of the current pulse generators in FIG. 6A and FIG. 6B and the generation of the respective currents $I_1$, $I_2$. If the switch S is closed at time $t_1$ when the time at which the pulse interval is recognized has passed from time $t_0$ when the previous current pulse has reached the end point, current flows through the coil L. This current does not flow to the outside from the current pulse generator as a current pulse signal, but flows in a circuit closed by the power supply and the coil (current $I_2$). If the switch S is opened at time $t_2$ when the power is stored in the coil L and a current pulse is emitted, the power stored in the coil L flows as a current ($I_1$) of the current pulse from the current pulse generator to the outside.

Figure 8:
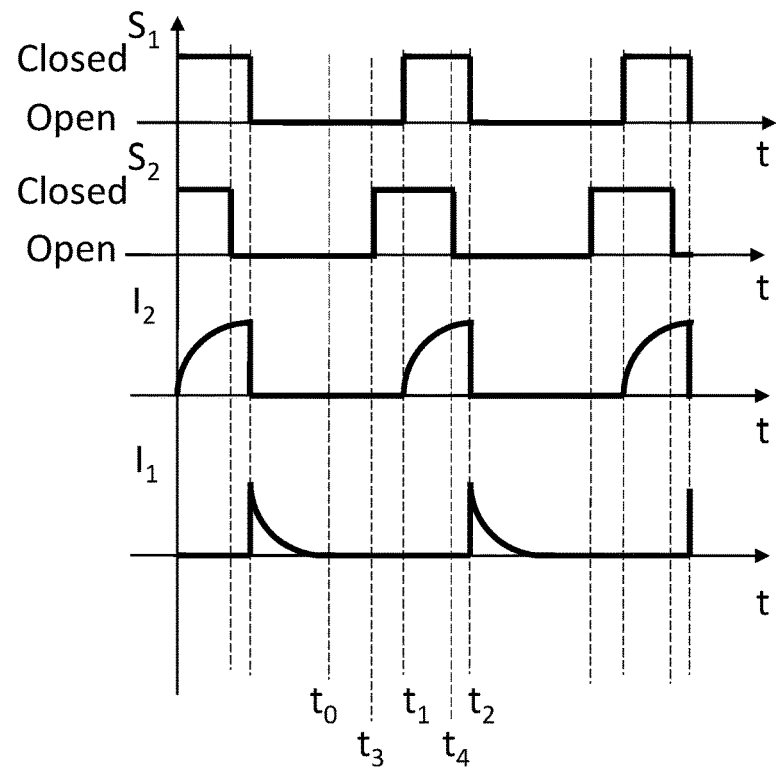
FIG. 8 shows a timing chart for explaining the synchronous control of a current pulse generator and a controllable unidirectional device according to an embodiment.

FIG. 8 shows a timing chart of the first switch $S_1$, the second switch $S_2$ of the current pulse generator of FIG. 6C, FIG. 6D and the respective currents $I_1$, $I_2$. The temporal relationship between the current $I_1$, $I_2$ and the first switch $S_1$ is the same as in FIG. 7. In FIG. 8, the timing of opening and closing of the second switch $S_2$ is added. When closing the second switch $S_2$ at time $t_0$ after the previous current pulse has reached the end point ($t_0 \leq t_3$), the power is supplied from the outside and the charge is accumulated in the capacitor C. At this point of time or time, the first switch $S_1$ is still open. If the switch $S_1$ is closed at time $t_3$ or later ($t_3 \leq t_1$), current flows from the capacitor C to the coil L. This current does not flow to the outside from the current pulse generator as a current pulse signal, but flows in a circuit closed by the power supply and the coil (current $I_2$). Next, when the second switch $S_2$ is opened and the first switch $S_1$ is opened at time $t_2$ when a current pulse is emitted, the power stored in the coil L flows as the current $I_1$ of the current pulse from the current pulse generator to the outside. In FIG. 8, the timing at which the second switch $S_2$ is opened (time $t_4$) is set between the timing at which the first switch $S_1$ is closed (time $t_1$) and the timing at which the first switch $S_1$ is opened (time $t_2$), but the present invention is not limited thereto. The timing of opening the second switch $S_2$ (time $t_4$) may be simultaneous with the timing of closing the first switch $S_1$ (time $t_1$) or later (i.e., $t_1 \leq t_4$). The timing of opening the second switch $S_2$ (time $t_4$) may be simultaneous with or prior to the timing of opening the first switch $S_1$ (i.e., $t_4 \leq t_2$).

In some embodiments, the current $I_1$ generated by the current pulse generator may correspond to a logic value "1", and the case in which the current $I_1$ is not recognized may correspond to a logic value "0". In some embodiments, the current $I_1$ generated by the current pulse generator may correspond to a logic value "0", and the case in which the current $I_1$ is not recognized may correspond to a logic value "1". The logical value may be another value.

Figure 9:
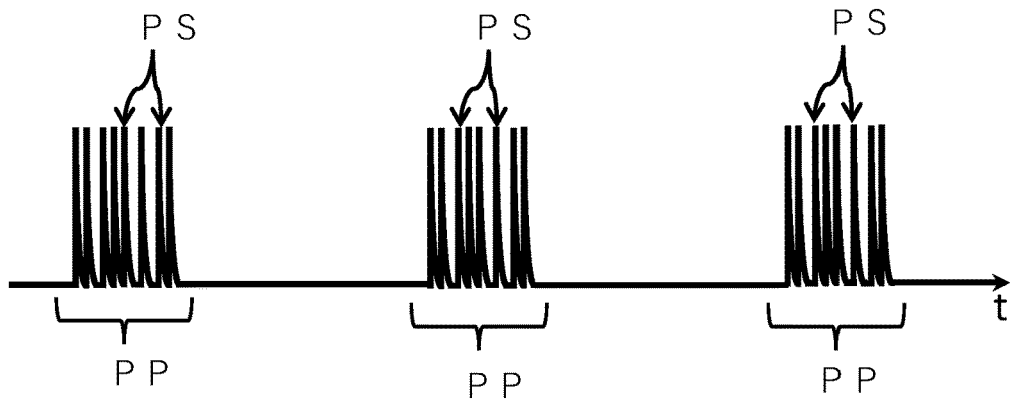
FIG. 9 shows a graph for explaining generation of current pulse packets according to an embodiment.

The current pulse generated by the current pulse generator may include one pulse, and may include a current pulse train, a current pulse group, or a pulse packet including a plurality of pulses. The current pulse generator may generate pulse packets multiple times, regularly or irregularly. As shown in FIG. 9, a plurality of pulse packets PP each including a plurality of pulses PS may be generated at a regular interval or at a regular frequency.

When generating current pulses including pulse packets, the current pulse generator may generate a first pulse of each pulse packet at a regular timing, at timings that are continuous at a regular interval, and at a randomly selected timing. In some embodiments, each pulse packet may be generated at a time interval equal to or greater than, or greater than, a value of time interval, such as 1 second, 3 seconds, 4 seconds, 5 seconds, 10 seconds, 30 seconds, 1 minute, 2 minutes, 3 minutes, 5 minutes, 10 minutes, 15 minutes, 20 minutes, 30 minutes, 1 hour, 2 hours, 3 hours, 4 hours, 5 hours, 6 hours, 12 hours, 24 hours, and the like. In some embodiments, each pulse packet may be generated at a time interval equal to or smaller than, or smaller than, a value of time interval such as 1 second, 3 seconds, 4 seconds, 5 seconds, 10 seconds, 30 seconds, 1 minute, 2 minutes, 3 minutes, 5 minutes, 10 minutes, 15 minutes, 20 minutes, 30 minutes, 1 hour, 2 hours, 3 hours, 4 hours, 5 hours, 6 hours, 12 hours, 24 hours, 2 days, 3 days, 5 days, 7 days, 10 days, 15 days, and the like. In some embodiments, the generation timing of each pulse can be randomly selected or set. For example, MCU or other electrical circuit may include a random number generator, and a current pulse generator may generate each pulse according to the timing generated by the random number generator.

The current pulse generator can have two operating states: generating a pulse and not generating a pulse. Each pulse generated by the current pulse generator may have a frequency equal to or greater than, or greater than, a value such as, for example, 1 Hz, 10 Hz, 50 Hz, 100 Hz, 500 Hz, 1 kHz, 5 kHz, 10 kHz, 50 kHz, 100 kHz, or 1 MHz, 5 MHz, 10 MHz, 50 MHz, 100 MHz, 500 MHz, and the like. The frequency may have a frequency equal to or greater than, or greater than, a value such as, for example, 500 MHz, 100 MHz, 50 MHz, 10 MHz, 5 MHz, 1 MHz, 100 kHz, 50 kHz, 10 kHz, 5 kHz, 1 kHz and the like, for each pulse generated by the current pulse generator.

The current pulse generated by the current pulse generator may function as a current signal containing some information. In some embodiments, the current pulse generator may generate a packet of current pulses or current pulses (pulse packet) incorporating information to be transmitted. The information included in the current signal can be encoded by the interval of individual pulses (interval time) in the case of a pulse packet. In some embodiments, the transmission information may be encoded by incorporation in the interval of individual pulses (interval time). Alternatively, the information included in the current signal can be encoded by incorporation in (or "as", the same in this disclosure) the pulse height. Alternatively, the information included in the current signal can be encoded by incorporation in the pulse width. Alternatively, the information included in the current signal can be encoded by incorporation in the frequency of the pulses. The current pulse generator can generate a current pulse or a packet of current pulses (pulse packet) incorporating the information to be transmitted. In some embodiments, the transmission information may be encoded by incorporation in the interval of pulses (interval time). In some embodiments, the transmission information may be encoded by incorporation in the height of the pulse. In some embodiments, the transmission information may be encoded by incorporation in the height of the pulse. In some embodiments, the transmission information may be encoded by incorporation in the width of the pulse. In some embodiments, the communicated information may be encoded by incorporation in the frequency of the pulse. The encoding of the transmission information is not limited to the above. Transmission information may be incorporated into other characteristics and encoded in other modulation methods.

Figure 10:
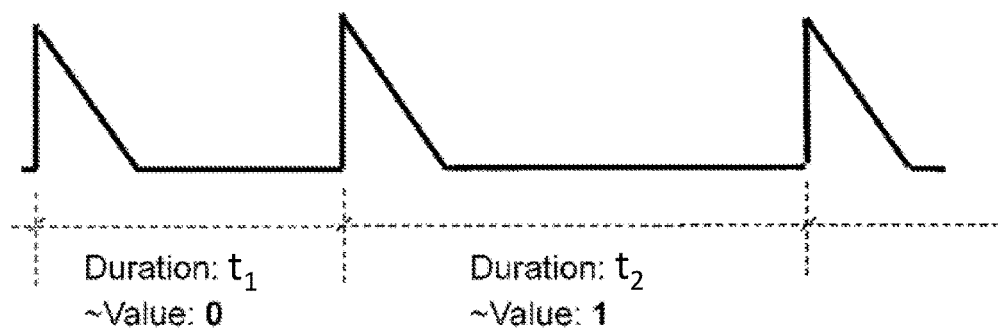
FIG. 10 shows a graph for explaining an encoding by incorporating the information into the interval time of current pulses according to an embodiment.

FIG. 10 shows an example of encoding by incorporation in the interval time of current pulses, that is pulse width modulation (PWM). In FIG. 10, the interval time of the current pulses is defined as the period of two pulses that are generated successively so that they are recognized as sufficiently separate pulses. Alternatively, as shown in FIG. 10, the interval time of current pulses may be defined as the time from the start (start point) of one pulse to the start (start point) of the next pulse. In some embodiments, the interval time may be defined as the time from the end of a current pulse to the start of a subsequent current pulse. In FIG. 10, the value "0" is encoded as $t_1$ between two pulses (interval time), and the value "1" is encoded as $t_2 \neq t_1$, $t_2 > t_1$, for example, $t_2 = 2 \times t_1$.

Figure 11:
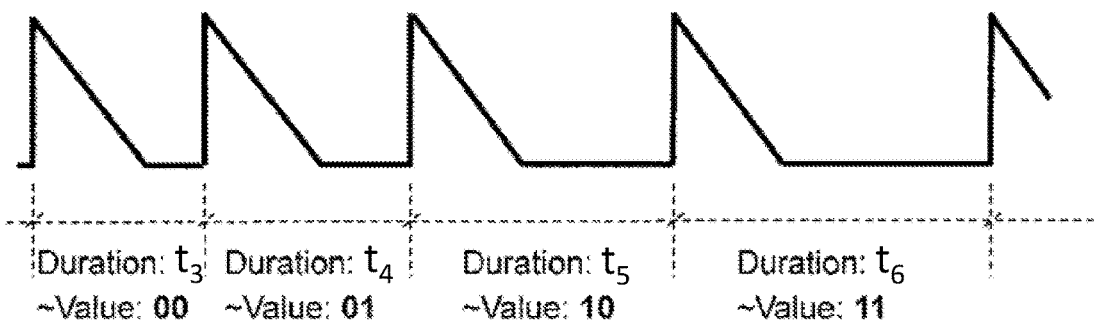
FIG. 11 shows a graph for explaining an encoding by incorporating the information into the interval time of current pulses according to an embodiment.

FIG. 11 shows another example of encoding by incorporation in the interval time of current pulses, that is pulse width modulation (PWM). In FIG. 11, the interval time of the current pulses is counted as the time from the start of one pulse to the start of the next. In FIG. 11, the values "00", "01", "10", and "11" are encoded as $t_3$, $t_4$ ($>t_3$), $t_5$ ($>t_4$), and $t_6$ ($>t_5$), respectively.

By encoding as shown in FIG. 10 and FIG. 11, information can be sent or transmitted as binary digital information.

The aspects of FIG. 10, FIG. 11 are non-limiting and other forms of encoding may be employed.

The controllable unidirectional device may be or include an electrical device or component. The controllable unidirectional device allows the current to flow in substantially only one direction and can prevent the current from flowing in the other direction. The controllable unidirectional device allows forward current to flow from the positive input terminal toward the positive output terminal while substantially blocking reverse current flowing from the positive output terminal toward the positive input terminal. In some embodiments, the controllable unidirectional device is configured such that its switching characteristics can be controlled by the MCU.

Figure 12A:
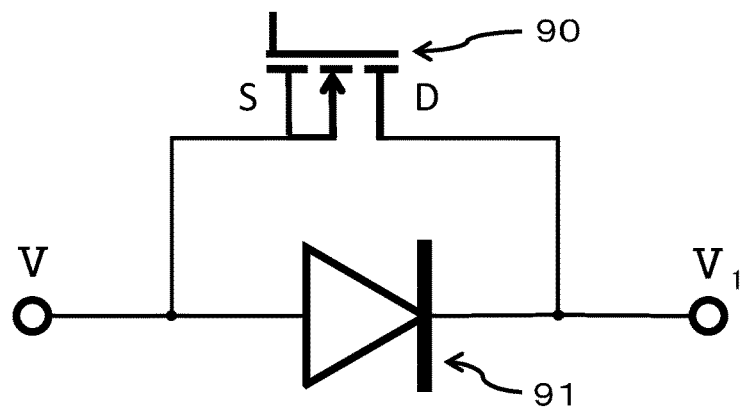
FIG. 12A shows a circuit diagram illustrating a configuration example of a controllable unidirectional device according to an embodiment.
Figure 12B:
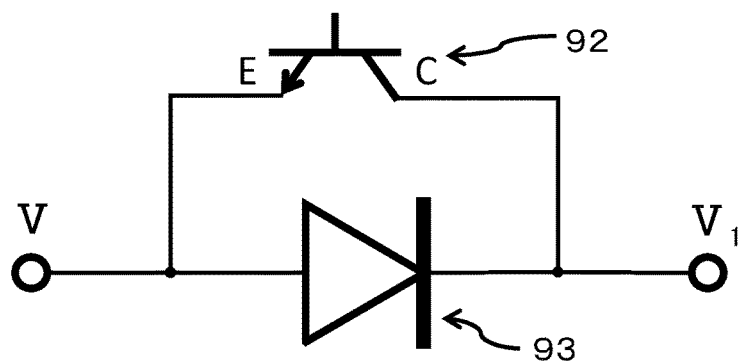
FIG. 12B shows a circuit diagram illustrating a configuration example of a controllable unidirectional device according to an embodiment.
Figure 12C:
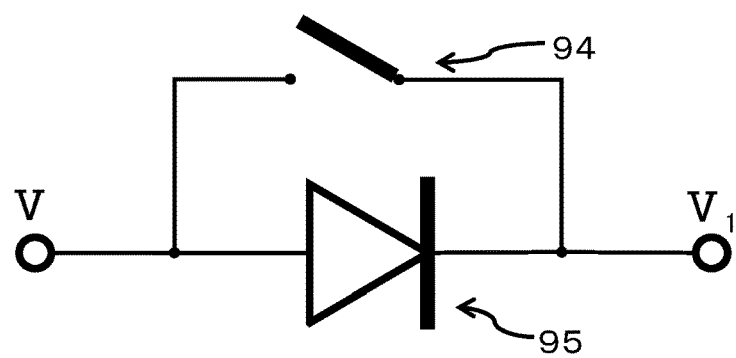
FIG. 12C shows a circuit diagram illustrating a configuration example of a controllable unidirectional device according to an embodiment.
Figure 12D:
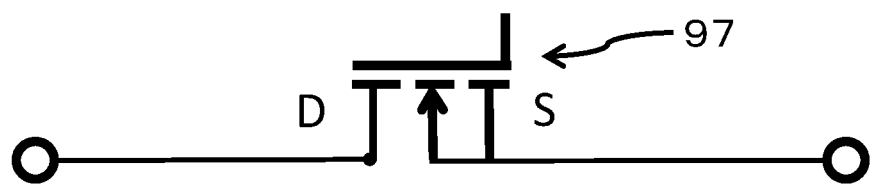
FIG. 12D shows a circuit diagram illustrating a configuration example of a controllable unidirectional device according to an embodiment.
Figure 12E:
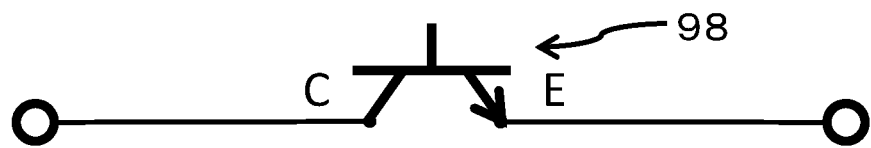
FIG. 12E shows a circuit diagram illustrating a configuration example of a controllable unidirectional device according to an embodiment.
Figure 12F:
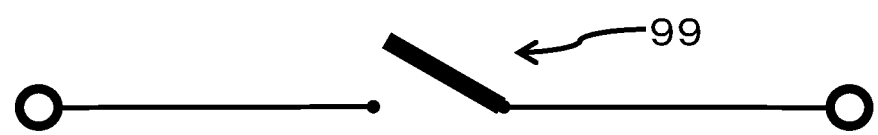
FIG. 12F shows a circuit diagram illustrating a configuration example of a controllable unidirectional device according to an embodiment.

FIG. 12A to FIG. 12F illustrate, in a non-limiting manner, some configuration examples of the controllable unidirectional devices. The controllable unidirectional devices shown in FIG. 12A to FIG. 12C are configured to have a combination of a diode and a switch (or an electronic control switch). The controllable unidirectional devices shown in FIG. 12F to FIG. 12D are configured to have a switch (or an electronic control switch) or consists substantially of a switch (or an electronic control switch). In the controllable unidirectional devices shown in the FIG. 12A, FIG. 12B, FIG. 12D and FIG. 12E, transistors are used for the switches. In FIG. 12A and FIG. 12D, MOSFETs are used for the transistors. In FIG. 12B and FIG. 12E, bipolar transistors are used for the transistors. In the controllable unidirectional devices shown in FIG. 12C and FIG. 12F, relays are used for the switches. The control system is not shown in FIG. 12F to FIG. 12A.

Transistors may be, for example, field-effect transistors (FET, MOSFET), bipolar transistors (BT), insulated gate bipolar transistors (IGBT) or bipolar junction transistors (BJT) or the like.

The controllable unidirectional devices shown in FIG. 12A and FIG. 12B are configured by connecting a transistor and a diode in parallel so that the reverse direction of the transistor is parallel to the forward direction of the diode. The cathode of the diode is connected to the positive output terminal of the power line communication apparatus, and the anode of the diode is connected to the positive input terminal of the power line communication apparatus.

In the controllable unidirectional device shown in FIG. 12A, the switch 90 includes a MOSFET, the source of which is connected to the cathode of diode 91 and to the positive input terminal, the drain of which is connected to the anode of diode 91 and is connected to the positive output terminal. In FIG. 12A, the voltage drop $V_{drop}$ of the switch 90 is smaller than the voltage drop $V_{drop}$ of the diode 91.

In the controllable unidirectional device shown in FIG. 12B, the switch 92 includes a bipolar transistor, the emitter of which is connected to the cathode of diode 93 and to the positive input terminal, the collector of which is connected to the anode of diode 93 and is connected to a positive output terminal. In FIG. 12B, the voltage drop $V_{drop}$ of the switch 92 is smaller than the voltage drop $V_{drop}$ of the diode 93.

In the controllable unidirectional device shown in FIG. 12C, the switch 94 includes a relay, one end of which is connected to the cathode of diode 95 and to the positive input terminal, and the other end of which is connected to the anode of diode 95 and to the positive output terminal.

The controllable unidirectional devices shown in FIG. 12D and FIG. 12E consist substantially of a switch including a transistor, the transistor being arranged such that its forward direction is the forward direction of the current. In the controllable unidirectional device shown in FIG. 12D, the transistor of the switch 97 includes a field-effect transistor, the drain of which is connected to the positive input terminal and the source of which is connected to the positive output terminal. In the controllable unidirectional device shown in FIG. 12E the transistor of switch 98 includes a bipolar transistor, the collector of which is connected to the positive input terminal and the emitter of which is connected to the positive output terminal. The controllable unidirectional device shown in FIG. 12F consists substantially of the switch 99 including a relay, one end of which is connected to the positive input terminal, and the other end of which is connected to the male output terminal.

For example, the controllable unidirectional devices shown in FIG. 12F to FIG. 12A can change the impedance of the device, by opening and closing the switches 90,92, 94,97,98,99. In some embodiments, the impedance may be varied between while the current pulse generator is generating pulses (pulse packets, pulse trains, or each pulse) and while the current pulse generator is not generating pulses. In some embodiments, the impedance while the current pulse generator is not generating the pulse ($Z_n$) may be smaller than the impedance while the current pulse generator is generating the pulse ($Z_p$) ($Z_n < Z_p$).

The switches 90,92 shown in FIG. 12A, FIG. 12B have an on-resistance $R_{on}$. The on-resistance $R_{on}$ is the resistance of the switches 90,92 when the switches 90,92 are turned on. The smaller the on-resistance $R_{on}$, the smaller power is consumed by the switches 90,92. If the switches 90,92 of the controllable unidirectional devices are turned on while current pulses (each pulse in the case of pulse packets) are not being generated from the current pulse generator, the impedance ($Z_n$) of the controllable unidirectional device becomes the total resistance of the switches 90,92 and the diodes 91,93. On the other hand, if the switches 90,92 are turned off while current pulses are being generated, the impedance ($Z_p$) of the controllable unidirectional device becomes a single resistance of the diodes 91,93. The total resistance of the switch 90,92 and the diode 91,93 is smaller than the single resistance of the diode 91,93. Therefore, the power consumption at the controllable unidirectional device is reduced while the current pulses are not being generated from the current pulse generator.

TABLE 1

| Configuration | A/B/C | | Only diode |
|---|---|---|---|
| Pulse generation | Pulse | No Pulse | No Pulse/pulse |
| Potential | $V < V_1$ | $V > V_1$ | $V > V_1$ |
| Switch | Switch open | Switch closed | No switch (= switch open) |
| Current | $I_d = 0$ | $I_d > 0$ | $I_d > 0$ |
| Impedance | $Z_p \sim R_d$ | $Z_n = (R_d \times R_s)/(R_d + R_s)$ | $Z = R_d$ |

Table 1 shows a comparison between the impedance of the controllable unidirectional devices shown in the FIG. 12A to FIG. 12C with and without pulse generation and the impedance when only the diode is connected instead of the controllable unidirectional device.

While pulses are being generated, the potential V on the positive input terminal or the input side of the controllable unidirectional device is lower than the potential $V_1$ on the positive output terminal or the output side of the controllable unidirectional device ($V<V_1$). Also, the switch is open and the current flowing through the diode of the controllable unidirectional device is zero ($I_d=0$). The impedance of the controllable unidirectional device is substantially the same as the resistance value ($R_d$) of the diode ($Z_p \sim Z_d$). While a pulse is being generated, $V>V_1$, the switch is closed and current flows through the diode ($I_d>0$). During this time, the impedance of the controllable unidirectional device can be expressed by the resistance of the diode ($R_d$) and the resistance of the switch ($R_s$), as $Z_n=(R_d \times R_s)/(R_d+R_s)$. The right column of Table 1 shows the case where only the diode was connected instead of the controllable unidirectional device. Without pulses, $V>V_1$, but this is the same as the case without a switch of the controllable unidirectional device (the case where the switch is open), and thus current flows through the diode and its impedance is the resistance of the diode itself ($Z \sim R_d$). Therefore, the impedance ($Z_n=R_d \times R_s/(R_d+R_s)$) in the case of FIG. 12A to FIG. 12C while the pulse is not generated at least becomes smaller than the impedance ($Z \sim R_d$) when only the diode is connected instead of the controllable unidirectional device. That is, as compared with the case where only the diode is connected, the power consumption while at least the pulse is not generated is reduced when using a controllable unidirectional device.

Figure 13:
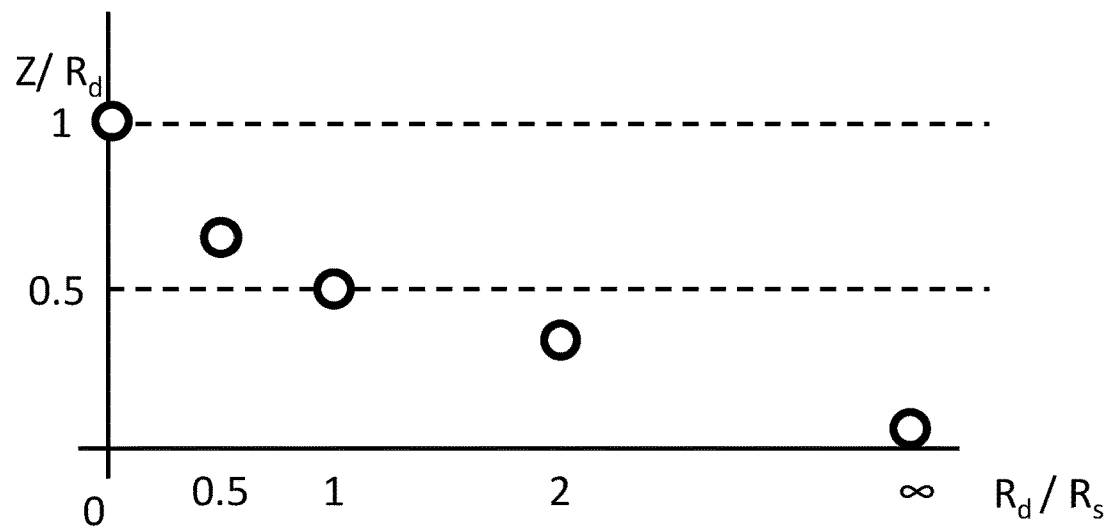
FIG. 13 shows a graph for explaining the impedance of a controllable unidirectional device according to an embodiment.

FIG. 13 shows the tendency of the impedance ($Zn=(R_d \times R_s)/(R_d+R_s)$) of the controllable unidirectional device shown in FIG. 12A to FIG. 12C. The smaller the resistance of the switch ($R_s$) is relative to the resistance of the diode ($R_d$), the smaller the impedance.

TABLE 2

| Configuration | D/E/F | | Only diode |
|---|---|---|---|
| Pulse generation | Pulse | No Pulse | No Pulse/pulse |
| Potential | $V < V_1$ | $V > V_1$ | $V > V_1$ |
| Switch | Switch open | Switch closed | No switch (= switch open) |
| Current | No current from power generator | Current from power generator | $I_d > 0$ |
| Impedence | $Z_p \sim \infty$ | $Z_n = R_s$ | $Z = R_d$ |

Table 2 shows a comparison between the impedance of the controllable unidirectional devices shown in the FIG. 12D to FIG. 12F with and without pulse generation and the impedance when only the diode is connected instead of the controllable unidirectional device.

The impedance while the pulse is not being generated remains the resistance of the switch ($R_s$). Thus, to reduce the impedance while the pulse is not being generated lower than when only the diode was connected instead of the controllable unidirectional device, the resistance of the switch ($R_s$) may be smaller than the resistance of the diode (or the on-resistance of the diode) when only the diode is used. Here the on-resistance of the diode 162 is a resistance value when the forward voltage equal to or higher than the voltage difference between the anode and the cathode is a predetermined value (for example, 0.6 V) is applied. The transistor used as the electronic control switch for the controllable unidirectional device may be used that has an on-resistance smaller than the standard value as the on-resistance of common diodes formed by semiconductors using silicon.

Figure 14:
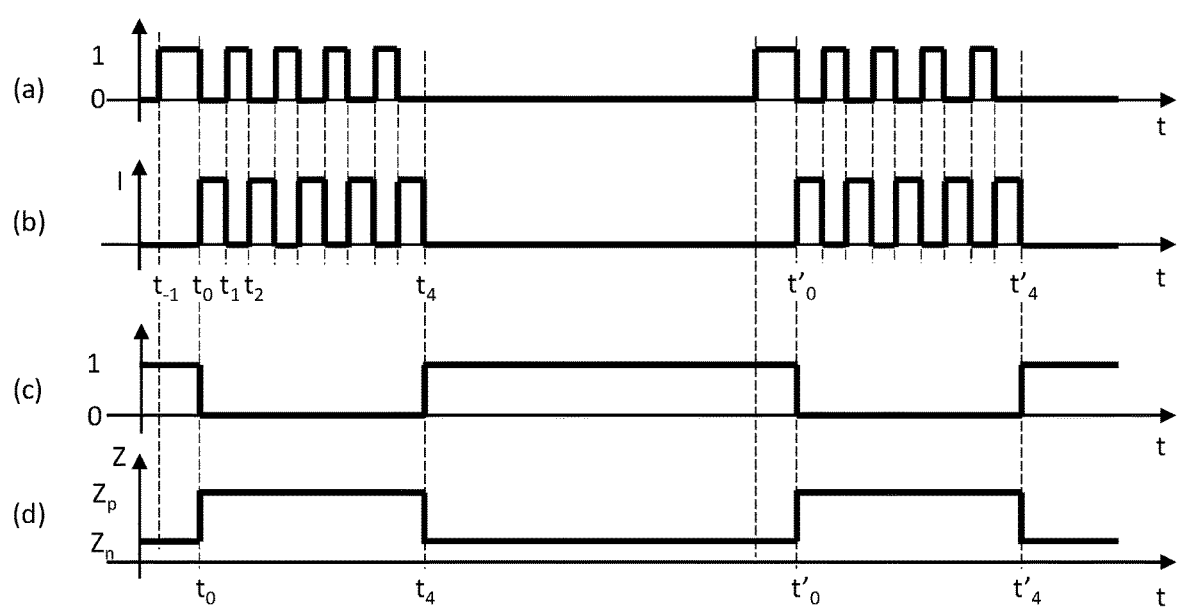
FIG. 14 shows a timing chart of the control signal, the pulse generation and the impedance change.
Figure 15:
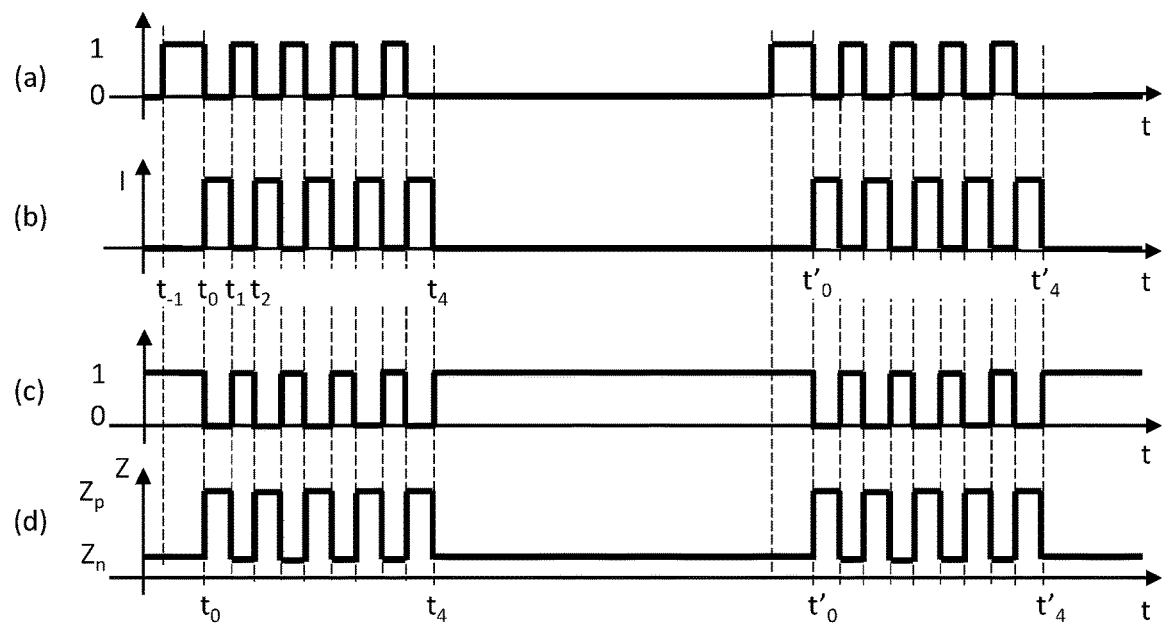
FIG. 15 shows a timing chart of the control signal, the pulse generation, and the impedance change.

FIG. 14 and FIG. 15 show timing charts for illustrating synchronous control of a current pulse generator and a controllable unidirectional device, or synchronous control of current pulses generated by a current pulse generator and impedance of a controllable unidirectional device, according to some embodiments. In either figure, the synchronization of (a) the control signal transmitted from the MCU to the current pulse generator, (b) the current pulse generated by the current pulse generator, (c) the control signal transmitted from the MCU to the controllable unidirectional device, and (d) the impedance of the controllable unidirectional device is shown.

The control signal transmitted from the MCU to the current pulse generator (a) is a signal for controlling the switch $S_1$ of FIG. 7 or FIG. 8. The signal for closing or keeping the switch $S_1$ closed is set to "1", and the signal for opening or keeping switch $S_2$ open is set to "0".

The current pulse generator has, in an exemplary manner, a configuration that charges the capacitor shown in FIG. 6C or FIG. 6D and discharges the charge to produce a current pulse. However, in FIG. 14(b) and FIG. 15(b), the current pulse is displayed as a square waveform as an example.

In FIGS. 14 and 15, a pulse packet ($t_0$ to $t_4$) begins to be generated at the start of the first pulse or at the start of the pulse packet ($t=t_0$). Here, the preparation of pulse generation started by the control signal "1" from the MCU received from the time $t=t_1<t_0$. A current pulse is generated when the control signal from the MCU changed from "1" to "0" ($t=t_1$). Current pulses are then generated ($t_2$ to $t_4$) by repeating or combining "1" and "0" of the control signal.

In FIG. 14 and FIG. 15, the control signal "0" transmitted from the MCU to the controllable unidirectional device causes the controllable unidirectional device to take a low impedance ($Z_n$), and the control signal "1" causes the controllable unidirectional device to take a high impedance ($Z_p$) ((c), (d)).

In FIG. 14, the controllable unidirectional device is controlled to have a high impedance ($Z_p$) while a current pulse packet is being generated ($t_0$ to $t_4$) and a low impedance ($Z_n$) while no current pulse packet is being generated ($t_4$ to $t'_0$).

Thus, in some embodiments, the impedance of the controllable unidirectional device may be controlled every occurrence of a current pulse packet that includes a plurality of current pulses. In some embodiments, the impedance of the controllable unidirectional device may be controlled in association with the generation of a current pulse packet including a plurality of current pulses.

In some embodiments, a pulse packet consisting of a plurality of pulses may be recognized as an information group such as one information unit, a part of an information unit, a sum of a plurality of information units, a sum of a part or the whole of each information unit of a plurality of information units, and impedance control may be performed using this information group as a unit. That is, the time between the start point and the end point of each information group or pulse packet may be defined as a period of time during which pulses are being generated, and the other time may be defined as the time during which no pulses are being generated.

In FIG. 15, the controllable unidirectional device is controlled to have a high impedance ($Z_p$) while an individual current pulse is being generated (for example, $t_0$ to $t_1$) even within a current pulse packet, and a low impedance ($Z_n$) while no individual current pulse is being generated (for example, $t_1$ to $t_2$). Thus, in some embodiments, the impedance of the controllable unidirectional device may be controlled on each occurrence of individual current pulses. In some embodiments, the impedance of the controllable unidirectional device may be controlled in association with the generation of discrete current pulses.

The timing of impedance switching coincides with the start and end of generation of current pulse packets or current pulses in FIG. 14 and FIG. 15, but in some embodiments, it may not coincide with the start and end of generation of current pulse packets or current pulses. In some embodiments, the current pulse packet or current pulse and the impedance of the controllable unidirectional device may be controlled or synchronized so that the power consumption is reduced relative to the case where it was high impedance ($Z_p$) at all time zones.

The above is an exemplary description, and the present disclosure is not limited thereto. The shape of the current pulse, the value and waveform of the control signal, the timing of the current pulse and impedance and the control signal, the relationship between the impedance and the current or current pulse packet and the contents described above may be changed as appropriate.

According to the present disclosure, by way of example, power consumption in a controllable unidirectional device or power communication device can be reduced while current pulses or current pulse packets are not being generated.

Figure 16:
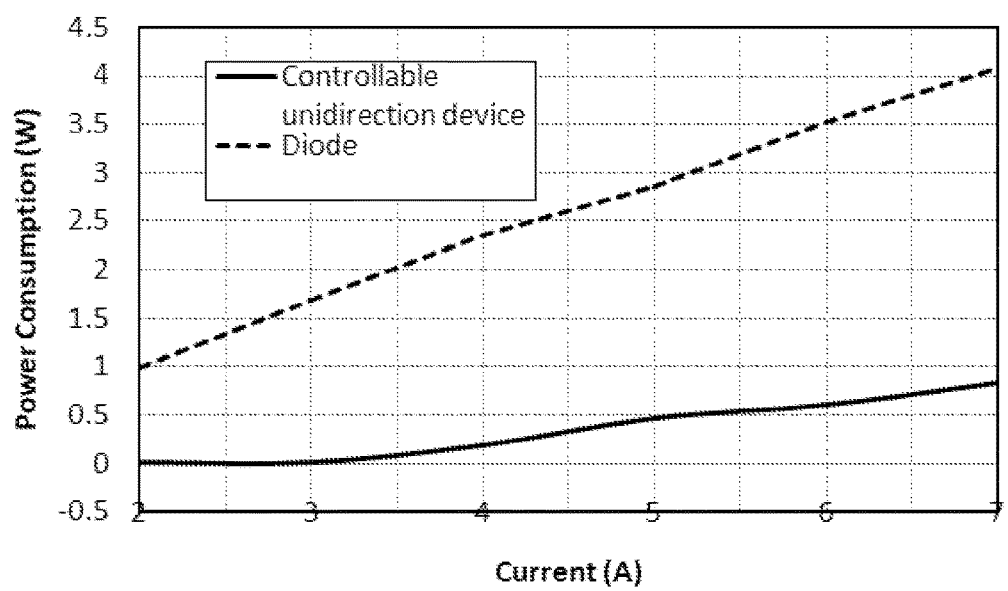
FIG. 16 shows a graph showing the power consumption in the case of using the controllable unidirectional device according to an embodiment and the power consumption in the case of using only a diode.

FIG. 16 shows a graph of the power consumption while current pulses are not being generated, comparing a case with a controllable unidirectional device according to an embodiment of the present disclosure is used (solid line) and a case where only a diode is used instead of a controllable unidirectional device (broken line). The horizontal axis indicates the generated current from the generator flowing through the controllable unidirectional device or diode, and the vertical axis indicates the respective power consumption. The power consumption is about ⅕ (generated current is 5 to 7 A) or 1/10 (generated current is 4 A) of that of diode-only, and is kept extremely low.

The degree of reduction in power consumption by the use of a controllable unidirectional device compared to the case with a diode only not limited to the above. In some embodiments, the degree of reduction in power consumption may be equal to or greater than, or greater than, a value such as 90%, 80%, 70%, 60%, 50%, 40%, 30%, 20%, 10%, and the like.

In some embodiments, the time during which a current pulse or a current pulse packet is not generated may be longer, substantially the same, or shorter than the time during which a current pulse or a current pulse packet is generated. The longer the time the current pulse or current pulse packet is not being generated, and the smaller the impedance therebetween, the greater the degree of reduction in power consumption.

Reduction in power consumption contributes to improving the generator efficiency, by way of example. Reduction of power consumption reduces the heat generation of the device, and contributes, for example, to prolonging the life of the device. Generally, it is said that the life of electrolytic capacitors such as aluminum electrolytic capacitors is greatly influenced by temperature. The life of an electrolytic capacitor is said to decrease with temperature in an Arrhenius fashion. The life of an electrolytic capacitor may greatly or most affect the life or the repair of the entire device. Therefore, extending the life of the electrolytic capacitor leads to extending the life of the entire device element or reducing maintenance labor such as repair.

Normally, the service life of aluminum electrolytic capacitors operating at the maximum core temperature allowed is 1000 to 10,000 hours. As an example of the experimental results, the temperature of the device was measured using an aluminum electrolytic capacitor with a maximum ambient temperature of 105° C. and a lifetime of 10,000 hours in an electric circuit. When a controllable unidirectional device according to an embodiment was used, the temperature of the circuit was about 50° C. In this case, the useful life of the capacitor is calculated to be about 51 years. On the other hand, when a diode was used instead of a controllable unidirectional device, the temperature of the circuit was about 80° C. In this case, the useful life of the capacitor is calculated to be about 6 years. That is, using a controllable unidirectional device instead of a diode increases the service life by 8.5 times.

Aluminum electrolytic capacitors are essentially electrochemical devices, and as the temperature increases, the rate of chemical reaction within the capacitor is accelerated, typically doubling as the temperature increases by 10° C.

For example, the ripple current increases and internal heat is generated. These are said to shorten the life of electrolytic capacitors. Thus, reducing the heat generation in the device can extend the life of the electrolytic capacitor and thus the lifetime of the entire device.

In some embodiments, the lifetime of a controllable unidirectional device according to the present disclosure may extend greater than, or greater than or equal to, a value such as 2 times, 3 times, 5 times, 6 times, 7 times, 8 times, 9 times, 10 times, 12 times, 15 times, 20 times, and the like when compared to using a diode instead of the controllable unidirectional device.

Next, an example of configuring a generator string using a power line communication apparatus according to an embodiment of the present disclosure will be described. FIG. 17 shows a configuration example of a generator string.

As shown in FIG. 17, a plurality of generator panels (for example, photovoltaic panels) $100_{-1}$ to $100_{-n}$ are connected in series via power line 118. The generator panel $100_{-1}$ to $100_{-n}$ include a DC generator $117_{-1}$ to $117_{-n}$ and a power line communication apparatus $110_{-1}$ to $110_{-n}$, respectively. The power line communication apparatuses $110_{-1}$ to $110_{-n}$ shown in FIG. 17 include bypass capacitors $122_{-1}$ to $122_{-n}$, each arranged to be connected in parallel with respect to the DC generators $117_{-1}$ to $117_{-n}$. By bypass capacitors $122_{-1}$ to $122_{-n}$ more, for example, each power line communication apparatus does not transmit the DC component of the signal coming from downstream, but can transmit the AC component.

In some embodiments, the power line communication device may comprise a bypass capacitor arranged to be connected in parallel to the generator.

As shown in FIG. 17, the positive input terminals $111_{-1}$ to $111_{-n}$ of the power line communication apparatuses $110_{-1}$ to $110_{-n}$ are connected to the positive terminals (outputs of the positive poles of the DC generators $117_{-1}$ to $117_{-n}$) of the DC generators $117_{-1}$ to $117_{-n}$, and the negative input terminals $112_{-1}$ to $112_{-n}$ of the power line communication apparatuses $110_{-1}$ to $110_{-n}$ are connected to the negative terminals of the DC generators $117_{-1}$ to $117_{-n}$ (outputs of the negative poles of the DC generators $117_{-1}$ to $117_{-n}$). The positive output terminals $113_{-1}$ to $113_{-n}$ of the power line communication apparatuses $110_{-1}$ to $110_{-n}$ are connected to the downstream side of the power line 118 (the side connected from the positive pole of the DC generators $117_{-1}$ to $117_{-n}$), and the negative output terminals $114_{-1}$ to $114_{-n}$ of the power line communication apparatuses $110_{-1}$ to $110_{-n}$ are connected to the upstream side of the power line 118 (the side connected from the negative pole of the DC generators $117_{-1}$ to $117_{-n}$). In the power line communication apparatuses $110_{-1}$ to $110_{-n}$, MCU $119_{-1}$ to $119_{-n}$ control the current pulse generators $115_{-1}$ to $115_{-n}$ and the controllable unidirectional devices $116_{-1}$ to $116_{-n}$.

With the string arrangement shown in FIG. 17, the power line communication apparatuses $110_{-1}$ to $110_{-n}$ can transmit power generated by the DC generators $117_{-1}$ to $117_{-n}$ by the power line 118. The power line communication apparatuses $110_{-1}$ to $110_{-n}$ can superimpose current signals generated as current pulses by the current pulse generators $115_{-1}$ to $115_{-n}$ on the current of the power line 118 based on the power generated by the DC generators $117_{-1}$ to $117_{-n}$, and transmit it. In the power line communication apparatuses $110_{-1}$ to $110_{-n}$, $119_{-1}$ to $119_{-n}$ control the current pulse generators $115_{-1}$ to $115_{-n}$ and the controllable unidirectional devices $116_{-1}$ to $116_{-n}$.

The junction box 300 is connected to the power line 118. The junction box 300 includes a configuration for taking out power from the power line 118 using an inverter (specifically, a DC/AC inverter or a DC/DC converter). The junction box 300 includes a configuration for receiving a current signal transmitted from the power line communication apparatuses $110_{-1}$ to $110_{-n}$ via the power line 118. For example, in this configuration, the change in current value can be taken out as a signal by using a current transformer.

The bypass capacitors $122_{-1}$ to $122_{-n}$ are connected in parallel with the DC generators $117_{-1}$ to $117_{-n}$. That is, the bypass capacitors $122_{-1}$ to $122_{-n}$ are connected between the positive input terminals $111_{-1}$ to $111_{-n}$ and the negative input terminals $112_{-1}$ to $112_{-n}$ of the power line communication apparatuses $110_{-1}$ to $110_{-n}$. With this configuration, the current signal sent from the negative pole side in the generator string can be sent to the positive pole side (in the direction of the current $I_{string}$ in FIG. 17). In some embodiments, the bypass capacitors may be provided in the power line communication apparatus $110_{-1}$-$110_{-n}$ as shown in FIG. 17. In some embodiments, the bypass capacitors may be provided outside of the power line communication apparatuses $110_{-1}$-$110_{-n}$.

The current pulse generators $115_{-1}$ to $115_{-n}$ of the power line communication apparatuses $110_{-1}$ to $110_{-n}$ can generate current signals (current pulses). The current signal generated by the current pulse generators $115_{-1}$-$115_{-n}$ is superimposed on the current flowing through the power line 118 and sent to the junction box 300. Since the power line communication apparatuses $110_{-1}$ to $110_{-n}$ comprise the controllable unidirectional devices $116_{-1}$ to $116_{-n}$, the current signal generated by the current pulse generators $115_{-1}$ to $115_{-n}$ does not flow in the direction of the bypass capacitors $122_{-1}$ to $122_{-n}$. If a portion of the current signal flows in the direction of the bypass capacitors $122_{-1}$ to $122_{-n}$, the power of the current signal to be directed to the power line 118 will be reduced, and the signal level and shape of the current signal may be deteriorated. In the above embodiment, the SN ratio of the current signal can be improved by suppressing the generation of such noise, for example.

The power line communication apparatuses $110_{-1}$ to $110_{-n}$ shown in FIG. 17 have been described as examples of using power line communication apparatuses $110_{-1}$ to $110_{-n}$ further comprising bypass capacitors $122_{-1}$ to $122_{-n}$ in the power line communication apparatus 20 shown in FIG. 2, but are not limited thereto. For example, the power line communication apparatus may be further provided with bypass capacitors $122_{-1}$ to $122_{-n}$ for the power line communication apparatus of FIG. 1, FIG. 3, FIG. 4 or other embodiments.

While various embodiments have been described above, the present disclosure is not limited thereto. For example, an electrical circuit may be further provided for processing to optimize the performance of the DC generator, and the electrical circuit may be connected to the DC generator. Performance optimization, as used herein, is, for example and without limitation, maximization of power generated by a DC generator. The performance to be optimized may be the output voltage, the output current or the output power of the DC generator controlled by the optimization reference value.

In some embodiments, the power line communication apparatus may comprise a generator switch or a protection circuit, or the like, which may block power transmission from the generator. The voltage across the generator string can become high. For example, the higher the brightness during photovoltaic power generation, the higher the voltage across the power line. For example, in natural disasters such as fire, landslide, strong winds, or other situations that may damage the system, the power lines may break, and damage such as electric shock may occur due to contact between people and animals. In such cases, the generator responsible by the power line communication apparatus may be disconnected from the power line to avoid or reduce the occurrence of electric shock or other damages. In some embodiments, during normal use, a heartbeat signal may be sent to the power line communication apparatus, and the power line communication apparatus may block power transmission from the generator to the power line if the heartbeat signal is not received for a predetermined period of time or longer in the event of an abnormality such as a disconnection (heartbeat type).

In some embodiments, for example as shown in FIG. 16, control of the impedance of the controllable unidirectional device may be performed on each pulse packet including a plurality of pulses.

Although in some embodiments described above, an example has been described in which a current pulse generator generates a positive current pulse with respect to the generated current transmitted on the power line, in some embodiments, the current pulse generator may generate a negative current pulse. In some embodiments, a power line transmission combining a positive current pulse and a negative current pulse may be performed. In some embodiments, the polarity of each device in the power line communication apparatus may be reversed from that of the above embodiments.

The disclosure also includes a power generation system comprising a power line communication apparatus according to the present disclosure. Generation systems may be photovoltaic, wind, hydro, geothermal, thermal, or nuclear power plants, and power systems used in them. In some embodiments, the power generation system may be a battery-powered storage, and may be a power supply system using the same. In some aspects, the power generation system may be a secondary battery system, or a battery system.

This disclosure includes photovoltaic elements, photovoltaic cells, photovoltaic panels, photovoltaic modules, photovoltaic array, photovoltaic power plants, and others that comprise wire communication devices described in this disclosure. In some embodiments, the photovoltaic panel may comprise a photovoltaic cell comprising a power line communication apparatus. In some embodiments, the photovoltaic array may comprise a photovoltaic module comprising a power line communication apparatus. In some embodiments, the photovoltaic array may comprise a photovoltaic panel comprising a power line communication apparatus. In some embodiments, the photovoltaic power plant may comprise a photovoltaic panel comprising a power line communication apparatus.

The disclosure also includes the following embodiments:

Item 1

A power line communication apparatus used in a power generation system, comprising:
a positive input terminal to be connected to a positive pole of a generator;
a negative input terminal to be connected to a negative pole of the generator;
a positive output terminal to be connected to a downstream side of a power line through which power generated by the generator is transmitted;
a negative output terminal to be connected to an upstream side of the power line;
a current pulse generator to be connected between the negative input terminal and the positive output terminal to generate a current pulse in the power line; and
a controllable unidirectional device to be connected between the positive input terminal and the positive output terminal, wherein the impedance is controllable.

Item 2

The power line communication apparatus according to item 1, wherein the controllable unidirectional device functions such that the impedance while the current pulse is not generated ($Z_n$) is smaller than the impedance while the current pulse is generated ($Z_p$).

Item 3

The power line communication apparatus according to item 1 or 2, wherein the current pulse includes a pulse packet including a plurality of pulses.

Item 4

The power line communication apparatus according to any one of items 1 to 3, wherein the controllable unidirectional device includes a switch.

Item 5

The power line communication apparatus according to item 4,
wherein the controllable unidirectional device includes a diode and a switch connected in parallel,
wherein the cathode of the diode is connected to the positive output terminal, and the anode of the diode is connected to the positive input terminal.

Item 6

The power line communication apparatus according to item 5, wherein the switch includes a transistor connected in parallel with the diode such that the reverse direction of the transistor is parallel to the forward direction of the diode.

Item 7

The power line communication apparatus according to item 5, wherein the switch includes a relay.

Item 8

The power line communication apparatus according to item 4, wherein the controllable unidirectional device substantially consists of a switch.

Item 9

The power line communication apparatus according to item 8,
wherein the switch substantially consists of a transistor and is connected between the positive input terminal and the positive output terminal, so that the forward direction of the transistor is in a direction toward the positive output terminal from the positive input terminal.

Item 10

The power line communication apparatus according to item 8, wherein the switch substantially consists of a relay.

Item 11

The power line communication apparatus according to any one of items 4 to 10, wherein the switch is configured to open while the current pulse is being generated and close while the current pulse is not being generated.

Item 12

The power line communication apparatus according to any one of items 1 to 11, further comprising a controller for controlling operation of the controllable unidirectional device.

Item 13

The power line communication apparatus according to item 12, wherein the controller further controls the generation of the current pulse by the current pulse generator.

Item 14

The power line communication apparatus according to item 12, further comprising a second controller for controlling the generation of the current pulse by the current pulse generator.

Item 15

The power line communication apparatus according to item 6 or 9, wherein the transistor comprises a transistor selected from MOSFET, BT, BJT and IGBT.

Item 16

The power line communication apparatus according to any one of items 1 to 15, further comprising a protection circuit capable of blocking power transmission from the generator.

Item 17

A power generation system comprising the power line communication apparatus according to any one of items 1 to 16.

Item 18

A photovoltaic panel comprising the power line communication apparatus according to any one of items 1 to 16.

Any of the above-described embodiments merely embody or illustrate some of the embodiments or examples of the present disclosure, and are not to be construed as limiting the scope of the disclosure. For example, each of the embodiments described above has been described in detail in order to explain the present disclosure in an easy-to-understand manner, and dimensions, configurations, materials, and circuits may be additionally changed as necessary.

It is intended that the appended claims cover numerous modifications to the embodiments without departing from the spirit and scope of the present disclosure.

Accordingly, the embodiments and examples disclosed herein have been shown by way of example and should not be considered as limiting the scope of the present disclosure.

REFERENCE SIGNS LIST

10, 20, 30, 50, 110$_{-1}$ to 110$_{-n}$ Power line communication apparatuses
11, 21, 31, 51, 111$_{-1}$ to 111$_{-n}$ Positive input terminals
12, 22, 32, 52, 112$_{-1}$ to 112$_{-n}$ Negative input terminals
13, 23, 33, 53, 113$_{-1}$ to 113$_{-n}$ Positive output terminals
14, 24, 34, 54, 114$_{-1}$ to 114$_{-n}$ Negative output terminals
15, 25, 35, 55, 115$_{-1}$ to 115$_{-n}$ Current pulse generator
16, 26, 36, 56, 116$_{-1}$ to 116$_{-n}$ Controllable unidirectional devices
17, 27, 37, 57, 117$_{-1}$ to 117$_{-n}$ DC generator
29, 39, 59, 119$_{-1}$ to 119$_{-n}$ MCU (controllers)
40 Detection circuit
60 Current sensor
61 Voltage sensor
62 Temperature sensor
90, 92, 94, 97, 98, 99 Switch
91, 93, 95 Diode
122$_{-1}$ to 122$_{-n}$ Bypass capacitor

The invention claimed is:

1. A power line communication apparatus used in a power generation system, comprising:
    a positive input terminal to be connected to a positive pole of a generator;
    a negative input terminal to be connected to a negative pole of the generator;
    a positive output terminal to be connected to a downstream side of a power line in which power generated by the generator is be transmitted;
    a negative output terminal to be connected to an upstream side of the power line;
    a current pulse generator to be connected between the negative input terminal and the positive output terminal, to generate a current pulse in the power line; and
    a controllable unidirectional device to be connected between the positive input terminal and the positive output terminal, wherein the impedance is controllable.

2. The power line communication apparatus according to claim 1, wherein the controllable unidirectional device functions such that the impedance while the current pulse is not generated ($Z_n$) is smaller than the impedance while the current pulse is generated ($Z_p$).

3. The power line communication apparatus according to claim 1, wherein the current pulse includes a pulse packet including a plurality of pulses.

4. The power line communication apparatus according to claim 1, wherein the controllable unidirectional device includes a switch.

5. The power line communication apparatus according to claim 4,
    wherein the controllable unidirectional device includes a diode and a switch connected in parallel,
    wherein the cathode of the diode is connected to the positive output terminal, the anode of the diode is connected to the positive input terminal.

6. The power line communication apparatus according to claim 5, wherein the switch includes a transistor connected in parallel with the diode such that the reverse direction of the transistor is parallel to the forward direction of the diode.

7. The power line communication apparatus according to claim 6, wherein the transistor comprises a transistor selected from MOSFET, BT, BJT and IGBT.

8. The power line communication apparatus according to claim 5, wherein the switch includes a relay.

9. The power line communication apparatus according to claim 4, wherein the controllable unidirectional device substantially consists of a switch.

10. The power line communication apparatus according to claim 9,
    wherein the switch substantially consists of a transistor and is connected between the positive input terminal and the positive output terminal so that the forward direction of the transistor is in a direction toward the positive output terminal from the positive input terminal.

11. The power line communication apparatus according to claim 9, wherein the switch substantially consists of a relay.

12. The power line communication apparatus according to claim 4, wherein the switch is configured to open while the current pulse is being generated and close while the current pulse is not being generated.

13. The power line communication apparatus according to claim 1, further comprising a controller for controlling operation of the controllable unidirectional device.

14. The power line communication apparatus according to claim 13, wherein the controller further controls the generation of the current pulse by the current pulse generator.

15. The power line communication apparatus according to claim 13, further comprising a second controller for controlling the generation of the current pulse by the current pulse generator.

16. The power line communication apparatus according to claim 1, further comprising a protection circuit capable of blocking power transmission from the generator.

17. A photovoltaic power generation module comprising the power line communication apparatus according to claim 1.

* * * * *